US012772508B2

(12) United States Patent
Lu et al.

(10) Patent No.: US 12,772,508 B2
(45) Date of Patent: Oct. 20, 2026

(54) CMOS FABRICATION METHODS FOR BACK-GATE TRANSISTOR

(71) Applicant: Taiwan Semiconductor Manufacturing Co., Ltd., Hsinchu (TW)

(72) Inventors: Chun-Chieh Lu, Taipei City (TW); Tzu Ang Chao, Hsinchu (TW); Chao-Ching Cheng, Hsinchu (TW); Lain-Jong Li, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/364,964

(22) Filed: Aug. 3, 2023

(65) Prior Publication Data

US 2023/0378334 A1 Nov. 23, 2023

Related U.S. Application Data

(62) Division of application No. 17/150,658, filed on Jan. 15, 2021, now Pat. No. 12,439,650.

(51) Int. Cl.
*H10D 48/36* (2025.01)
*H10D 30/67* (2025.01)
(Continued)

(52) U.S. Cl.
CPC ....... *H10D 48/362* (2025.01); *H10D 30/6729* (2025.01); *H10D 30/6739* (2025.01);
(Continued)

(58) Field of Classification Search
CPC .. H10D 48/362; H10D 84/85; H10D 30/6739; H10D 99/00; H10D 62/80;
(Continued)

(56) References Cited

U.S. PATENT DOCUMENTS

| | | | | |
|---|---|---|---|---|
| 7,492,015 B2 | 2/2009 | Chen et al. | | |
| 7,569,466 B2 * | 8/2009 | Callegari | ............ | H10D 84/038 257/369 |

(Continued)

FOREIGN PATENT DOCUMENTS

| | | | |
|---|---|---|---|
| CN | 105684135 A | 6/2016 | |
| CN | 106847837 A | 6/2017 | |

(Continued)

OTHER PUBLICATIONS

Hewa Y. Abdullah., "Theoretical study of the binding energy of some gases on Al-doped carbon nanotube," Results in Physics, vol. 6, Oct. 12, 2016, p. 5.

(Continued)

*Primary Examiner* — Nathan W Ha
(74) *Attorney, Agent, or Firm* — Slater Matsil, LLP

(57) ABSTRACT

A device includes a semiconductor substrate, a low-k dielectric layer over the semiconductor substrate, an isolation layer over the low-k dielectric layer, and a work function layer over the isolation layer. The work function layer is an n-type work function layer. The device further includes a low-dimensional semiconductor layer on a top surface and a sidewall of the work function layer, source/drain contacts contacting opposing end portions of the low-dimensional semiconductor layer, and a dielectric doping layer over and contacting a channel portion of the low-dimensional semiconductor layer. The dielectric doping layer includes a metal selected from aluminum and hafnium, and the channel portion of the low-dimensional semiconductor layer further comprises the metal.

20 Claims, 29 Drawing Sheets

(51) Int. Cl.

| | |
|---|---|
| ***H10D 62/80*** | (2025.01) |
| ***H10D 64/62*** | (2025.01) |
| ***H10D 84/02*** | (2025.01) |
| ***H10D 84/85*** | (2025.01) |
| ***H10D 99/00*** | (2025.01) |
| ***H10K 10/46*** | (2023.01) |
| ***H10K 10/84*** | (2023.01) |
| ***H10K 10/88*** | (2023.01) |
| ***H10K 19/10*** | (2023.01) |
| ***H10K 85/20*** | (2023.01) |
| ***H10P 14/20*** | (2026.01) |
| ***H10P 14/60*** | (2026.01) |
| ***H10P 14/692*** | (2026.01) |
| ***H10P 30/40*** | (2026.01) |
| ***H10W 74/10*** | (2026.01) |

(52) U.S. Cl.
CPC ......... *H10D 30/6757* (2025.01); *H10D 62/80* (2025.01); *H10D 64/62* (2025.01); *H10D 84/02* (2025.01); *H10D 84/85* (2025.01); *H10D 99/00* (2025.01); *H10K 10/466* (2023.02); *H10K 10/484* (2023.02); *H10K 10/84* (2023.02); *H10K 10/88* (2023.02); *H10K 19/10* (2023.02); *H10K 85/221* (2023.02); *H10P 14/3436* (2026.01); *H10P 14/6339* (2026.01); *H10P 14/69392* (2026.01); *H10P 30/40* (2026.01); *H10W 74/137* (2026.01)

(58) Field of Classification Search
CPC .... H10D 64/62; H10D 30/6729; H10D 84/02; H10K 19/10; H10K 85/221; H10K 10/466; H10K 10/84; H10K 10/88
See application file for complete search history.

(56) References Cited

U.S. PATENT DOCUMENTS 8,575,615 B2 * 11/2013 Saito .................... H10D 86/423 257/69
8,728,862 B2 5/2014 Ha et al.
8,916,914 B2 12/2014 Kim et al.
9,024,299 B2 * 5/2015 Li ...................... H10D 84/0181 257/40
9,620,501 B1 * 4/2017 Ellinger ............. H10D 30/6755
9,883,129 B2 * 1/2018 Kurokawa ............ H10F 39/809
9,905,657 B2 * 2/2018 Endo .................. H10D 30/6756
9,917,209 B2 * 3/2018 Endo .................. H10D 30/6757
9,960,354 B1 5/2018 Li et al.
10,483,287 B1 * 11/2019 Li ...................... H10D 30/6734
10,541,374 B2 * 1/2020 Li ........................ H10K 10/484
10,565,954 B2 2/2020 Saotome et al.
10,978,513 B2 4/2021 Jin
11,107,837 B2 8/2021 Yamazaki et al.
11,721,727 B2 * 8/2023 Baraskar .............. H10D 64/035
2004/0256620 A1 * 12/2004 Yamazaki ............ H10K 59/131 257/66
2005/0074963 A1 * 4/2005 Fujii ................. H01L 21/76802 257/E21.414
2008/0158682 A1 * 7/2008 Egi ...................... G02B 26/026 349/137
2008/0296563 A1 * 12/2008 Bourgoin ............... B82Y 10/00 257/E51.012
2008/0299702 A1 12/2008 Son et al.
2009/0008667 A1 * 1/2009 Fujii .................... H10K 71/135 438/22
2009/0045401 A1 * 2/2009 Yamazaki .......... H10D 30/0316 438/481
2009/0114903 A1 * 5/2009 Kalburge ............... H10K 19/10 977/762
2009/0325343 A1 * 12/2009 Lee ........................ H10D 88/01 438/455
2010/0001275 A1 1/2010 Kim et al.
2010/0012923 A1 1/2010 Hiura et al.
2010/0176387 A1 * 7/2010 Kuzumoto ............. H10K 10/84 257/E51.001
2010/0295047 A1 * 11/2010 Moriguchi ......... H10D 30/0314 257/E21.411
2012/0007988 A1 * 1/2012 Ikeda .................... G06F 3/0412 348/E5.09
2014/0131698 A1 5/2014 Kim et al.
2015/0325669 A1 * 11/2015 Zhu ........................ H10D 84/85 438/587
2016/0035753 A1 * 2/2016 Liu .................... H10D 30/6757 257/66
2016/0111522 A1 * 4/2016 Chuang .............. H10D 84/0177 438/591
2016/0126101 A1 * 5/2016 Ellinger ............... H10D 86/423 438/586
2017/0194581 A1 7/2017 Li
2017/0229554 A1 * 8/2017 Choi .................... H10D 86/441
2018/0151837 A1 * 5/2018 Furuie ................ H10K 59/8722
2018/0226046 A1 8/2018 Saotome et al.
2018/0315781 A1 11/2018 He et al.
2018/0342514 A1 * 11/2018 Lin ...................... H10D 64/017
2019/0088722 A1 3/2019 Zhao et al.
2019/0181367 A1 6/2019 Farmer et al.
2022/0115629 A1 * 4/2022 Suzuki ............... G02B 19/0014
2022/0231153 A1 * 7/2022 Lu ..................... H01L 21/02178
2023/0009509 A1 * 1/2023 Minami ............... H10K 59/876

FOREIGN PATENT DOCUMENTS

JP 2007134721 A 5/2007
JP 2009065057 A 3/2009
KR 2010005900 A 1/2010
KR 20140085115 A 7/2014
KR 20150092722 A 8/2015
KR 101904383 B1 10/2018
KR 102026811 B1 10/2019
TW 201818552 A 5/2018
WO 2020068812 A1 4/2020
WO 2020113205 A1 6/2020

OTHER PUBLICATIONS

Javey, et al., "High Performance n-Type Carbon Nanotube Field-Effect Transistors with Chemical Doped Contacts," Nano Letters, vol. 5n No. 2, Jan. 5, 2005, pp. 345-348.
Klinke, et al., "Charge Transfer Induced Polarity Switching in Carbon Nanotube Transistors," Nano Letters, Feb. 23, 2005, 4 pages.
Park, Yong Ju, et al., "Controllable P- and N-Type Conversion of MoTe2 via Oxide Interfacial Layer for Logic Circuits," Nano-Micro Small, vol. 15, No. 28, Article No. 1901772, May 17, 2019, p. 10.
Wei, et al. "Air-Stable Technique for Fabricating n-Type Carbon Nanotube FETs," 2011 International Electron Devices Meeting, Dec. 5-7, 2011, 4 pages.

* cited by examiner

CMOS FABRICATION METHODS FOR BACK-GATE TRANSISTOR

PRIORITY CLAIM AND CROSS-REFERENCE

This application is a divisional of U.S. patent application Ser. No. 17/150,658, filed Jan. 15, 2021, and entitled "CMOS Fabrication Methods for Back-Gate Transistor," which application is incorporated herein by reference.

BACKGROUND

In recent development of integrated circuits, two dimensional (2D) semiconductor electronic devices were studied. A 2D transistor may include a 2D channel, which includes a channel having the thickness in atomic scale, with the channel formed between two insulator layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
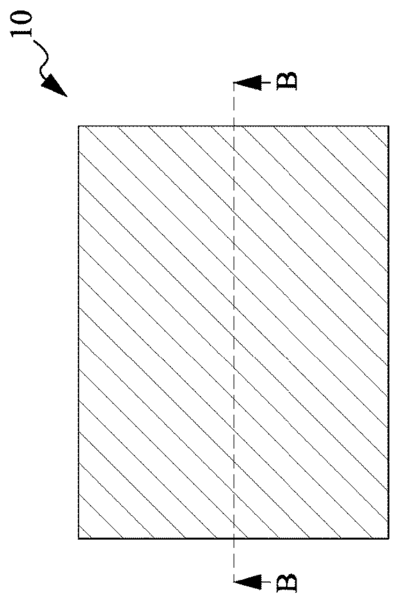
FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the top views and cross-sectional views of intermediate stages in the formation of a Complementary Metal-Oxide-Semiconductor (CMOS) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Complementary Metal-Oxide-Semiconductor (CMOS) device and the method of forming the same are provided in accordance with some embodiments. The CMOS device includes a p-type MOS (PMOS) device and an n-type MOS (NMOS) device, which are formed based on two-dimensional channels such as Carbon Nanotubes (CNT) as channel materials. Appropriate channel doping is made to improve the NMOS device in order to achieve NMOS behavior rather than PMOS behavior. The metals of source/drain contact plugs of the PMOS device and the NMOS device are selected to reduce contact tunneling barrier. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B illustrate the top views and cross-sectional views of intermediate stages in the formation of a CMOS device in accordance with some embodiments of the present disclosure. The corresponding processes are also reflected schematically in the process flow shown in FIG. 29.

Figure 1B:
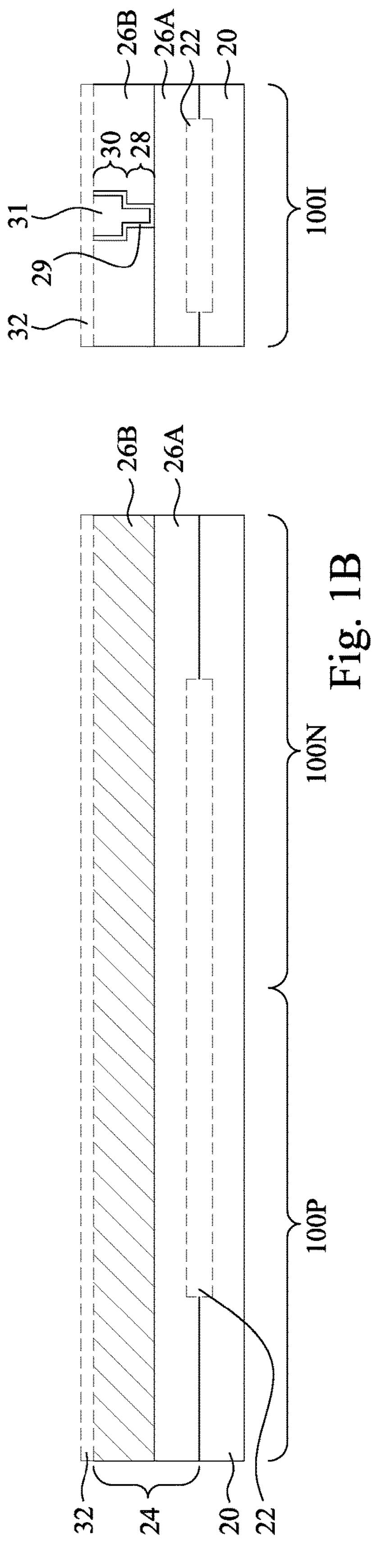

FIGS. 1A and 1B illustrate a top view and a cross-sectional view, respectively, of a portion of wafer 10, which includes substrate 20. The substrate 20 may be a semiconductor substrate, such as a bulk semiconductor substrate, a Semiconductor-On-Insulator (SOI) substrate, or the like. Substrate 20 may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In accordance with some embodiments, the semiconductor material of semiconductor substrate 20 may include silicon; germanium; a compound semiconductor including gallium arsenic, gallium phosphide, indium phosphide, indium arsenide, and/or indium antimonide; an alloy semiconductor including SiGe, carbon-doped silicon, GaAsP, AlInAs, AlGaAs, GaInAs, GaInP, and/or GaInAsP; or combinations thereof. Substrate 20 may also be formed of other materials such as sapphire, Indium tin oxide (ITO), or the like.

In accordance with some embodiments, active devices 22, which may include transistors (such as planar transistors, Fin Field Effect Transistors (FinFETs), or the like) may be formed at the surface of semiconductor substrate 20. The transistors may have semiconductor materials such as silicon, silicon germanium, or the like as channel materials. In accordance with alternative embodiments, active devices 22 are not formed. Accordingly, active devices 22 are illustrated as being dashed to show that they may, or may not, be formed.

Over substrate 20 may reside interconnect structure 24, which may include dielectric layers such as Inter-Layer Dielectric (ILD), and may or may not include Inter-Metal Dielectrics (IMDs) over the ILD. In accordance with some embodiments, the ILD is formed of or comprises silicon oxide, phospho-silicate glass (PSG), boro-silicate glass (BSG), boron-doped phospho-silicate glass (BPSG), fluorine-doped silicate glass (FSG), or the like. The ILD may be formed using spin coating, Flowable Chemical Vapor Deposition (FCVD), or the like. In accordance with alternative embodiments of the present disclosure, the ILD is formed using a deposition method such as Plasma Enhanced Chemical Vapor Deposition (PECVD), Low Pressure Chemical Vapor Deposition (LPCVD), or the like. Contact plugs (not shown) such as source/drain contact plugs, gate contact plugs, etc., may be formed in the ILD.

Interconnect structure 24 may also include IMD(s). In accordance with some embodiments of the present disclosure, the IMDs are formed of low-k dielectric materials having dielectric constants (k-values) lower than about 3.0. The IMDs may comprise Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of the IMDs includes depositing a porogen-containing dielectric material and then performing a curing process to drive out the porogen, and hence the remaining IMDs are porous. Metal lines and vias (not shown) may be formed in the IMDs. The IMDs may have metal lines and vias therein. An example of the metal lines and vias is represented by metal line 30 and via 28, which are in dielectric layer 26B. The dielectric layer(s) underlying dielectric layer 26B are collectively shown as 26A.

In accordance with some embodiments, the subsequently formed CMOS devices are over layers 26A and 26B. Layer 26A may be an ILD having contact plugs (not shown) therein. Layer 26B may be an IMD. In accordance with alternative embodiments, the to-be-formed CMOS devices are over ILD layer 26A, and no IMD is underlying the CMOS devices. In accordance with yet alternative embodiments, the CMOS devices and the subsequently formed isolation layer 32 are formed on substrate 20 directly, with no ILD and IMD underlying the CMOS devices and isolation layer 32.

In accordance with some embodiments, metal lines 30 and the underlying vias 28 are formed using a damascene process, which includes etching dielectric layer 26B to form a via opening and a trench over and joined with the via opening, filling the via opening and the trench with conductive materials, and performing a planarization process such as a Chemical Mechanical Polish (CMP) process or a mechanical grinding process to remove excess portions of the conductive materials. Metal lines 30 and vias 28 may include diffusion barrier layer 29 and copper-containing material 31 over diffusion barrier layers 29. Diffusion barrier layer 29 may include titanium, titanium nitride, tantalum, tantalum nitride, or the like. Diffusion barrier layer 29 has the function of preventing the copper in copper-containing material 31 from diffusing into dielectric layer 26B. Diffusion barrier layer 29 may also act as a glue layer.

As shown in FIG. 1B, isolation layer 32 is formed. Isolation layer 32, which may also act as an etch stop layer, may be formed over interconnect structure 24 or in physical contact with substrate 20. In accordance with some embodiments of the present disclosure, isolation layer 32 is formed of or comprises an oxide such as silicon oxide, a nitride such as silicon nitride, a high-k dielectric material such as aluminum oxide, hafnium oxide, zirconium oxide, lanthanum oxide, or the like.

As also shown in FIG. 1B, wafer 10 includes PMOS region 100P and NMOS region 100N, in which a PMOS device and an NMOS device, respectively, are to be formed, which collectively form a CMOS device. Furthermore, device region 100I is also shown, which will not have PMOS and NMOS devices formed therein. It is appreciated that although metal line 30 and via 28 are shown in device region 100I, the metal lines and vias may also be formed in device regions 100P and 100N, and may be directly underlying the PMOS device and the NMOS device that are to be formed in subsequent processes. In some of the subsequent figures, device region 100I is not shown. In the subsequent processes starting from FIGS. 1A and 1B and ending with FIGS. 18A and 18B, each of the figure numbers includes letter "A," or "B." The letter "A" indicates that the respective figure shows a top view. The letter "B" indicates that the respective figure shows the reference cross-section "B-B" in the respective top view.

Figure 2A:
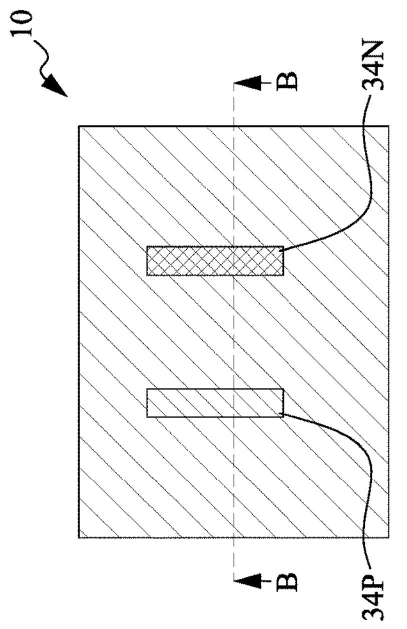
Figure 2B:
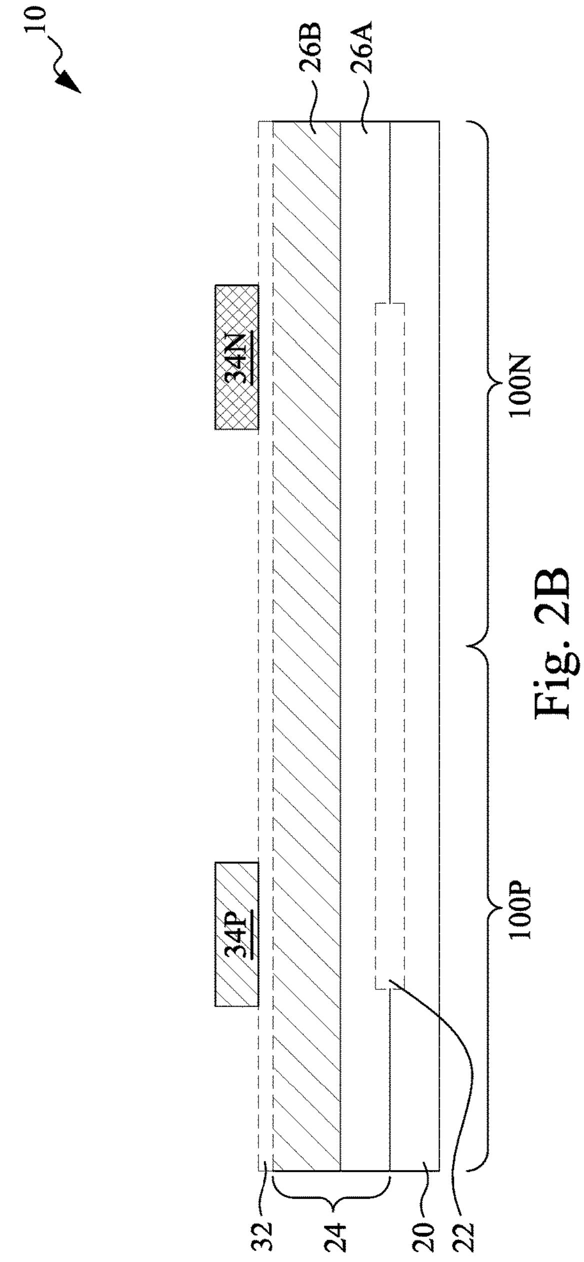
Figure 29:
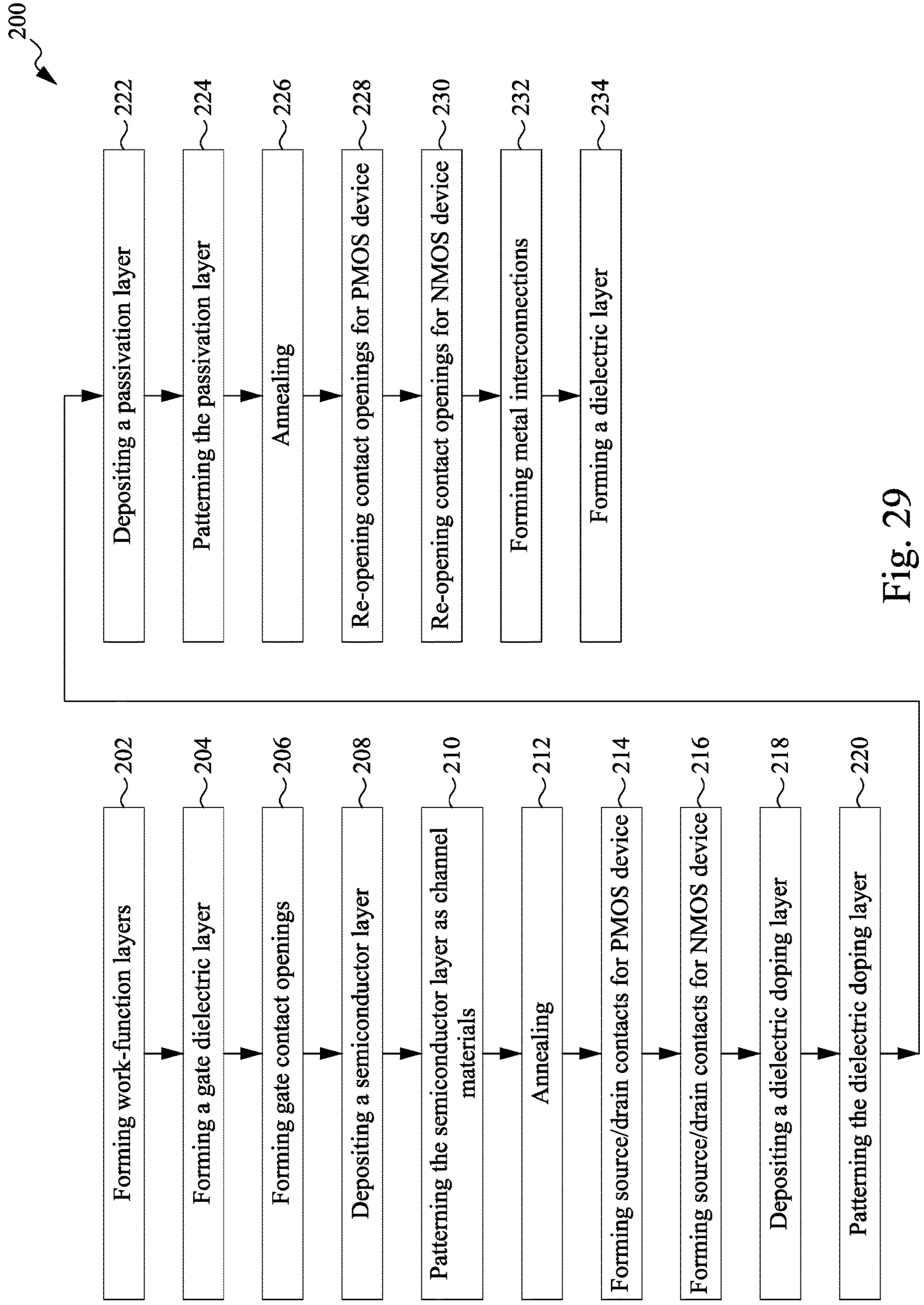
FIG. 29 illustrates a process flow for forming a CMOS device in accordance with some embodiments.

FIGS. 2A and 2B illustrate a top view and a cross-sectional view, respectively, in the formation of p-type work-function layer 34P and an n-type work-function layer 34N. The respective process is illustrated as process 202 in the process flow 200 as shown in FIG. 29. The formation of each of p-type work-function layer 34P and n-type work-function layer 34N may include depositing a blanket metal layer, and then patterning the blanket metal layer through a photolithography process. In accordance with some embodiments, the p-type work-function layer 34P may be formed of or comprises a metal such as platinum (Pt), palladium (Pd), gold (Au), or the alloys thereof. The n-type work-function layer 34N may be formed of or comprises a metal such as Al, Ti, or the alloys thereof. The thicknesses of work-function layers 34P and 34N may be in the range between about 1 nm and about 10 nm. The formation method may include Physical Vapor Deposition (PVD), Chemical Vapor Deposition (CVD), or the like. Work-function layers 34P and 34N act as the gate electrodes of the respective PMOS and NMOS devices, and are referred to as gate electrodes 34P and 34N, respectively.

Figure 3A:
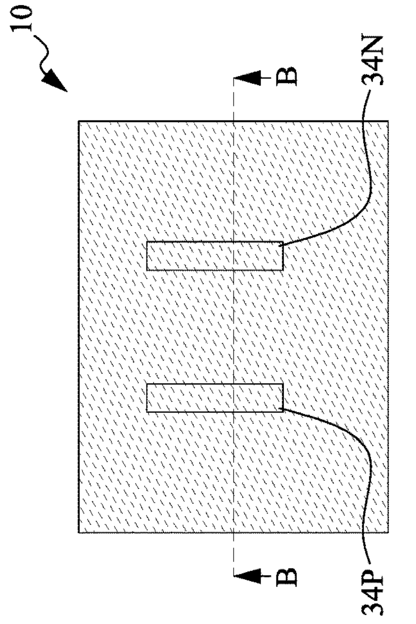
Figure 3B:
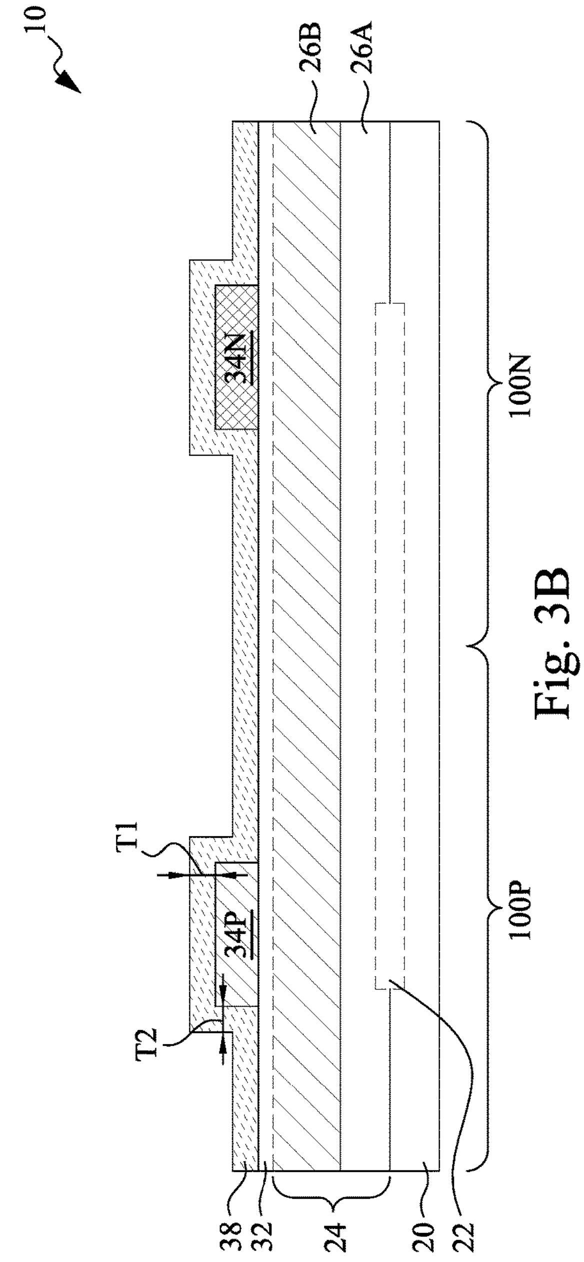
Figure 25:
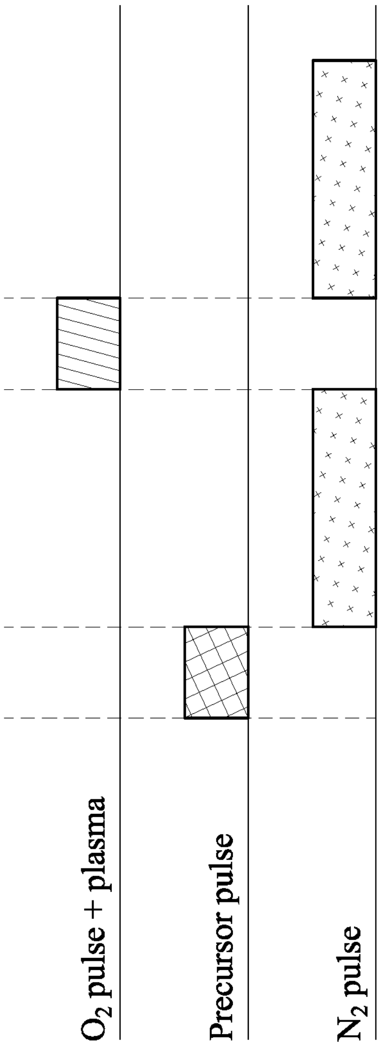
FIGS. 25 through 28 illustrate the cycles of some atomic layer deposition processes in accordance with some embodiments.

FIGS. 3A and 3B illustrate a top view and a cross-sectional view, respectively, in the formation of gate dielectric layer 38. The respective process is illustrated as process 204 in the process flow 200 as shown in FIG. 29. In accordance with some embodiments, the gate dielectric layer comprises a high-k dielectric material such as $HfO_2$, $Al_2O_3$, $ZrO_2$, or the like, while other materials such as silicon oxide may also be used. The deposition method may include Atomic Layer Deposition (ALD), CVD, or the like. Gate dielectric layer 38 is formed as a conformal layer extending on the top surface and the sidewalls of p-type work-function layer 34P and n-type work-function layer 34N. For example, the difference between the horizontal thickness T1 of the horizontal portions and the thickness T2 of the vertical portions of gate dielectric layer 38 may be smaller than 20 percent or 10 percent of both of thicknesses T1 and T2. An ALD cycle of an example ALD process for forming $HfO_2$ is illustrated in FIG. 25, which is discussed in detail in subsequent paragraphs. In accordance with some embodiments, the thickness of gate dielectric layer 38 is in the range between about 1 nm and about 15 nm.

Figure 4A:
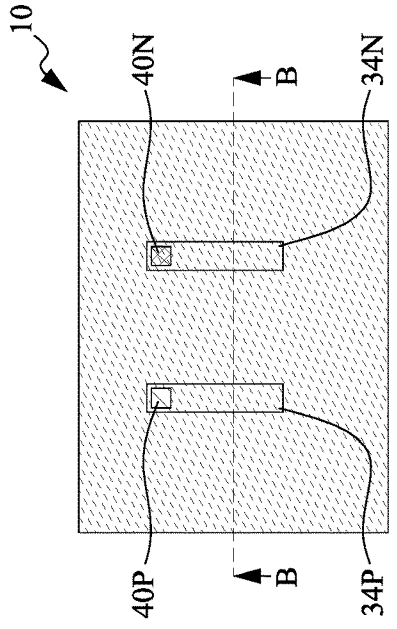
Figure 4B:
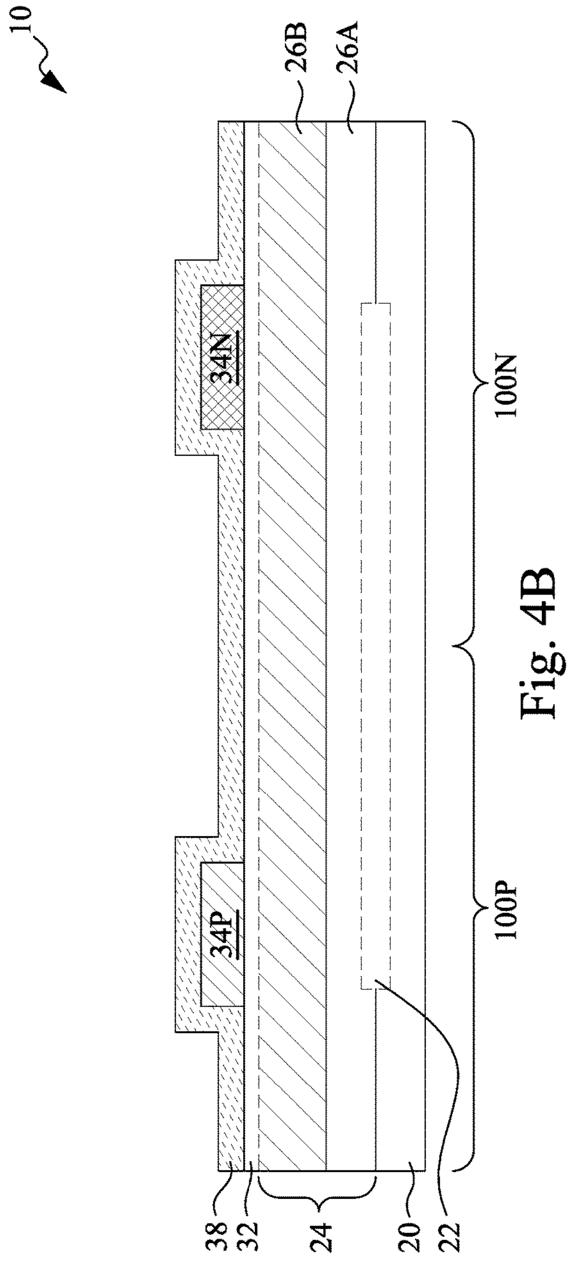
Figure 15A:
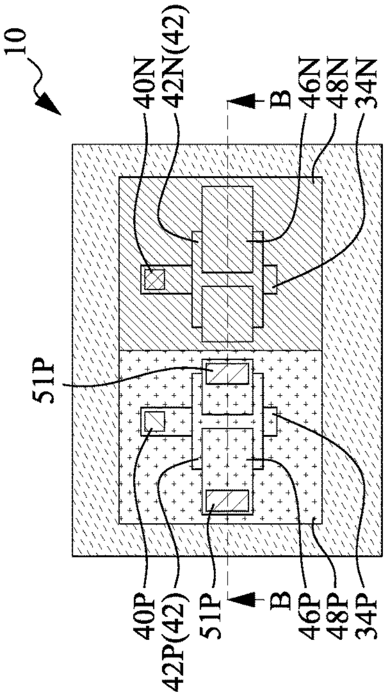
Figure 15B:
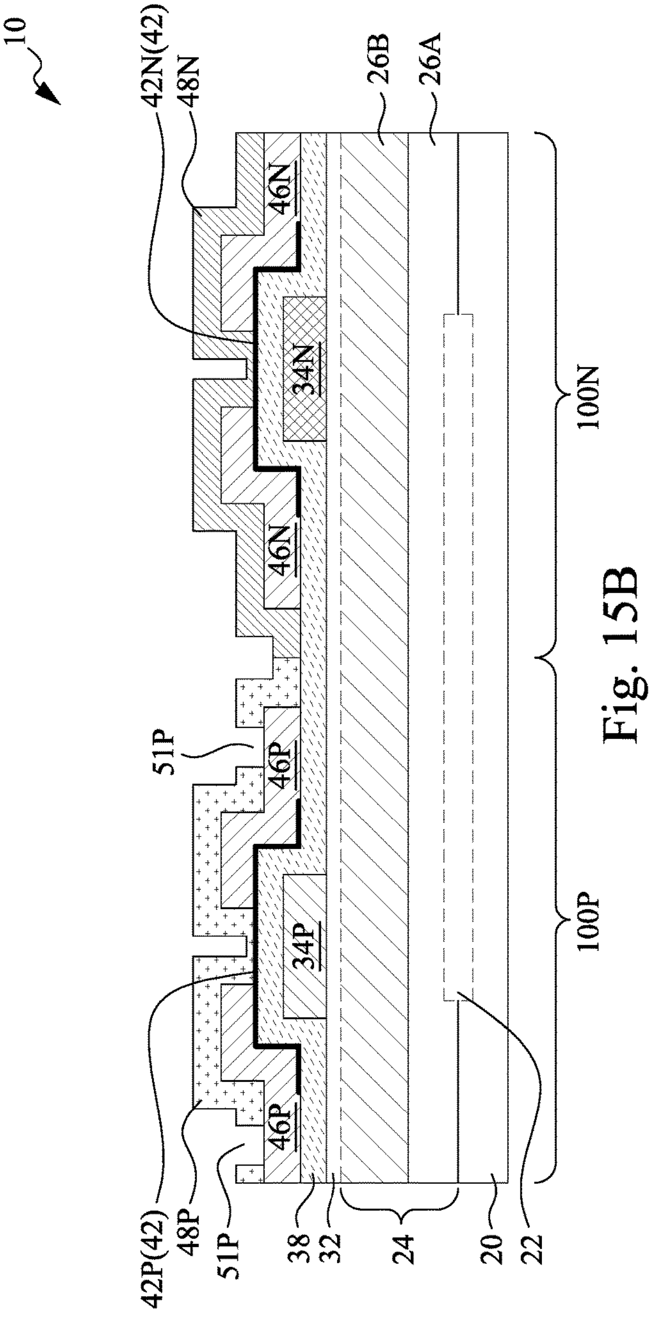

FIGS. 4A and 4B illustrate a top view and a cross-sectional view, respectively, in the formation of gate contact openings 40P and 40N in gate dielectric layer 38. The respective process is illustrated as process 206 in the process flow 200 as shown in FIG. 29. In accordance with some embodiments, the formation of gate contact openings 40P and 40N includes an etching process, with a patterned photo resist formed to define the positions of via openings 40P and 40N. As shown in FIG. 4A, gate electrodes 34P and 34N are revealed through gate contact openings 40P and 40N, respectively. The etching may be performed through a wet etching process or a dry etching process. The formation of gate contact openings 40P and 40N is for the easier formation of gate contact openings as shown in FIGS. 15A and 15B, so that fewer layers need to be etched. In accordance with alternative embodiments of the present disclosure, the process shown in FIGS. 4A and 4B is skipped.

Figure 5A:
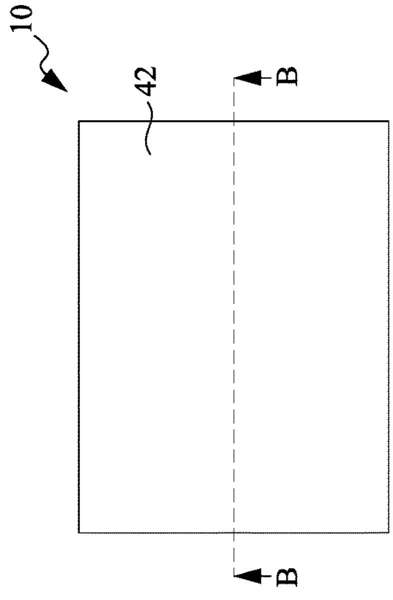
Figure 5B:
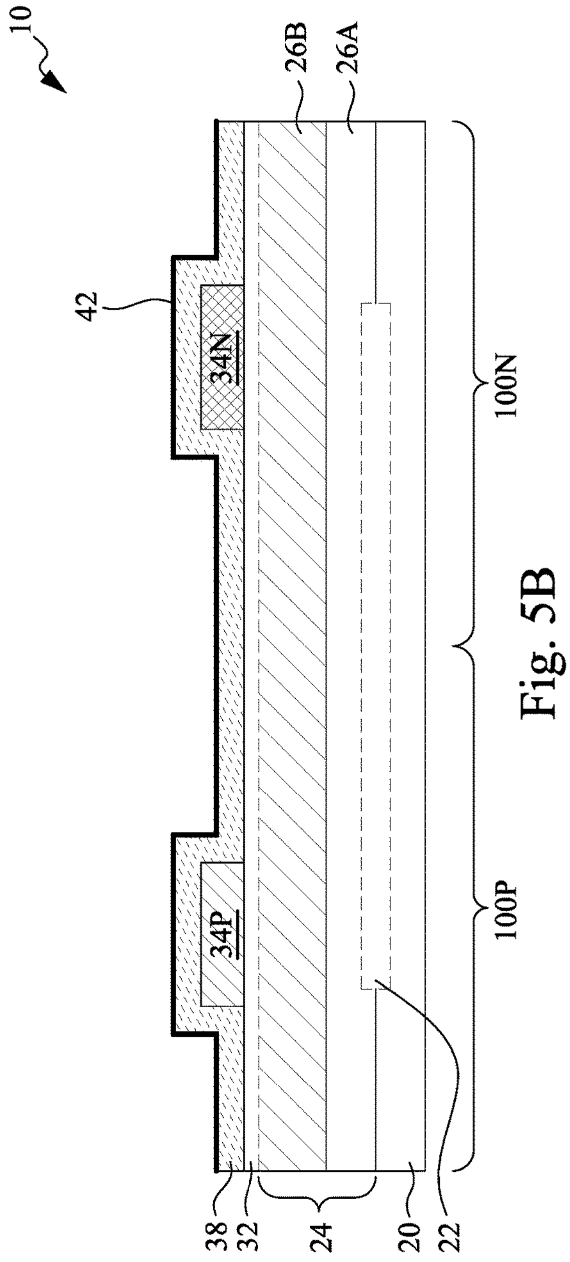

Referring to FIGS. 5A and 5B, semiconductor layer 42 is formed through deposition. The respective process is illustrated as process 208 in the process flow 200 as shown in FIG. 29. In accordance with some embodiments of the present disclosure, semiconductor layer 42 is formed of a low-dimensional material, which may include carbon nanotube networks, aligned carbon nanotubes, two-dimensional (2D) materials such as Transition Metal Dichalcogenides (TMDs), or the like. The carbon nanotube networks and aligned carbon nanotubes may be formed using immersion, drop-casting, or the like methods. The TMD material may be the compound of a transition metal and a group-VIA element. The transition metal may include W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. For example, semiconductor layer 42 may be formed of or comprise $MoS_2$, $MoSe_2$, $WS_2$, $WSe_2$, or the like. The formation of the TMD material may include CVD, for example, with $MoO_3$ powder and sulfur (s) (or Se) powder being used as precursors, and nitrogen ($N_2$) being used as a carrier gas. In accordance with alternative embodiments of the present disclosure, PECVD or another applicable method may be used to form the TMD material. In accordance with some embodiments of the present disclosure, semiconductor layer 42 has a thickness in the range between about 0.7 nm and about 5 nm. Semiconductor layer 42 is also formed as a conformal layer, for example, with the variation of the thicknesses of the horizontal portions and vertical portions being smaller than about 20 percent or 10 percent.

Figure 6A:
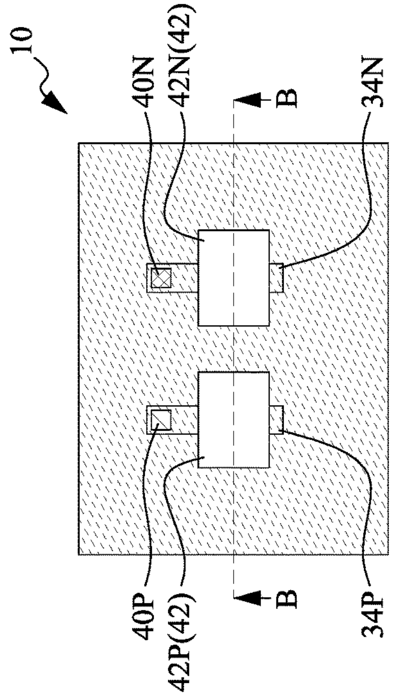
Figure 6B:
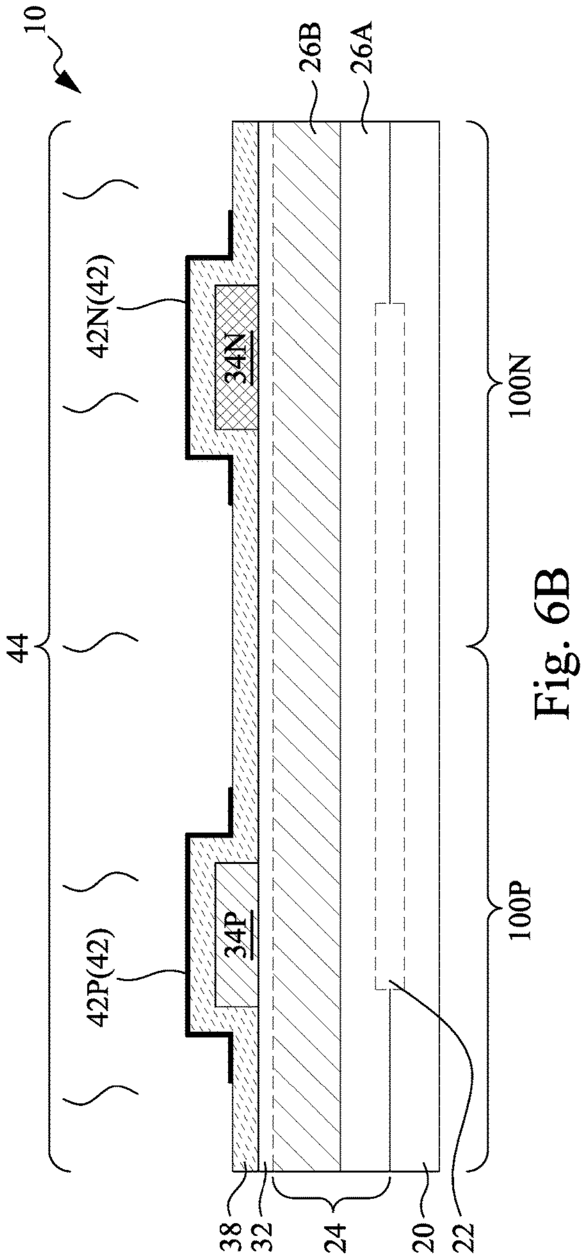

FIGS. 6A and 6B illustrate a top view and a cross-sectional view, respectively, in the patterning of semiconductor layer 42 into portions 42P and 42N in device regions 100P and 100N, respectively. Portion 42P and portion 42N of semiconductor layer 42 will act as the channel material and some parts of source/drain regions of the respective PMOS device and the NMOS device. The respective process is illustrated as process 210 in the process flow 200 as shown in FIG. 29. The patterning may be performed by forming a photo resist, and then performing an etching process to remove some portions of semiconductor layer 42, so that the remaining portions 42P and 42N are disconnected from each other. Furthermore, the portions of semiconductor layer 42 extending into via openings 40P and 40N are also etched, revealing via openings 40P and 40N again, as shown in FIG. 6A. An appropriate etchant is selected corresponding to the material of semiconductor layer 42. For example, when semiconductor layer 42 is formed of carbon nanotube networks and aligned carbon nanotubes, an oxygen-based etching gas such as $O_2$, $O_3$, or combinations thereof may be used as the etching gas.

Figure 7A:
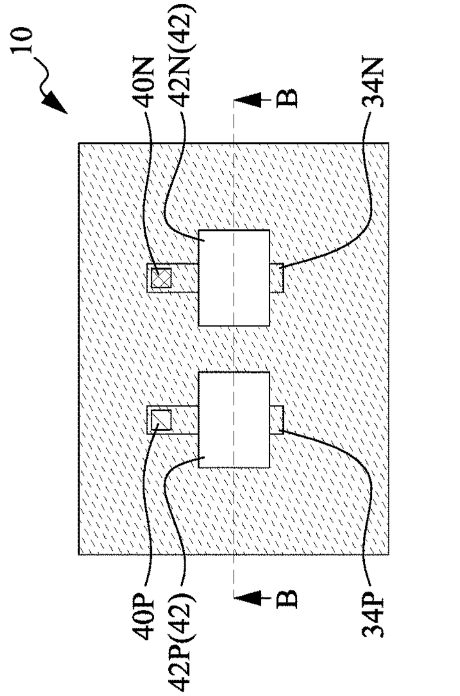
Figure 7B:
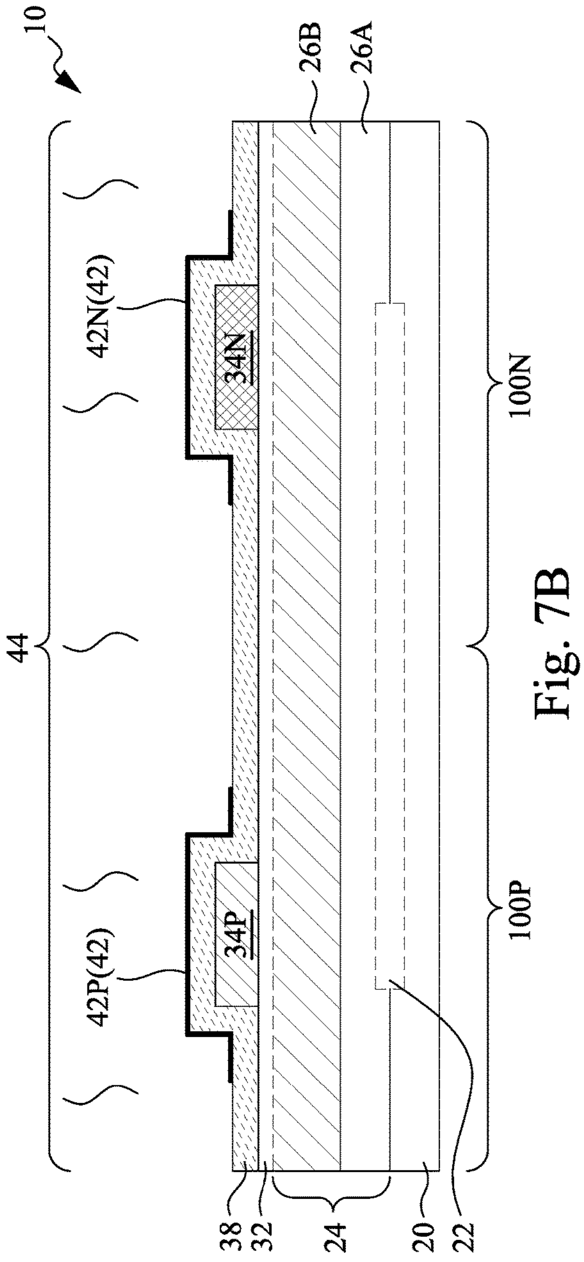

Referring to FIGS. 7A and 7B, an annealing process 44 (marked in FIG. 7B) is performed. The respective process is illustrated as process 212 in the process flow 200 as shown in FIG. 29. The corresponding process gas used for the annealing process may include forming gas, which includes hydrogen ($H_2$) and nitrogen ($N_2$). In accordance with some embodiments, the annealing process 44 is performed at a temperature in the range between about 250° C. and about 400° C. Carrier gas such as Ar, He, and/or Ne may be added. The annealing duration may be in the range between about 30 minutes and about 60 minutes. The flow rate of hydrogen in the forming gas may be in the range between about 13 percent and about 15 percent of the flow rate of the carrier gas. The ambient pressure during the annealing process may be in the range between about 100 torr and one atmosphere. The annealing process may cure the semiconductor layer 42 and gate dielectric layer 38 to improve their quality. For example, the density of gate dielectric layer 38 may be less porous after the annealing process 44.

Figure 8A:
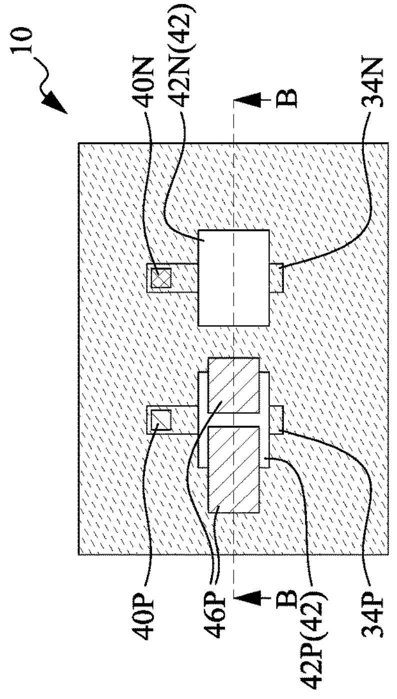
Figure 8B:
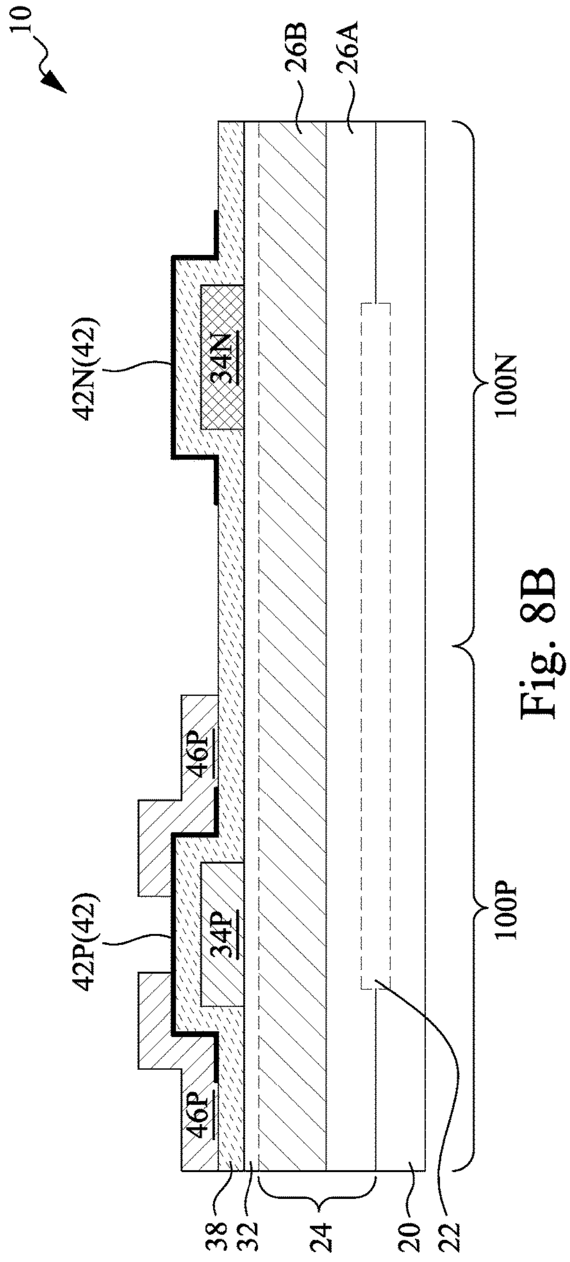

FIGS. 8A and 8B illustrate a top view and a cross-sectional view, respectively, in the formation of the source/drain contacts 46P. The respective process is illustrated as process 214 in the process flow 200 as shown in FIG. 29. In accordance with some embodiments, the formation process includes depositing a conductive material, which may include a metal such as Pt, Pd, or the like, or an alloy thereof, and then performing an etching process to pattern the conductive material. The deposition method may include PVD, CVD, or the like. The thickness of the conductive material may be in the range between about 10 nm and about 50 nm. The patterned conductive material form source/drain contacts 46P, which are in physical contact with the opposing end portions of semiconductor layer 42P. FIGS. 8A and 8B illustrate that each of the source/drain contacts 46P includes a portion overlapping a portion of gate electrode 34P, with a portion of the semiconductor layer 42P being exposed through the source/drain contacts 46P to act as the channel of the PMOS device.

Figure 9A:
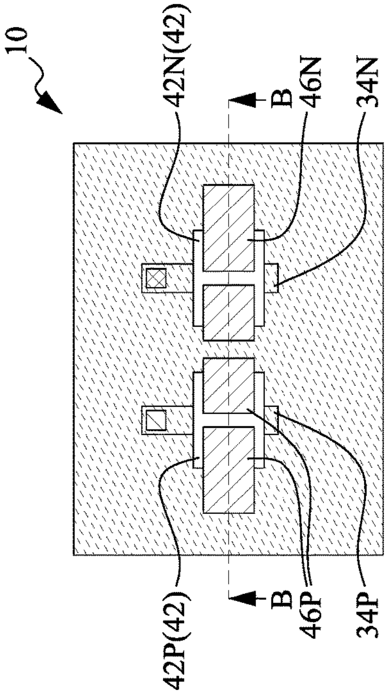
Figure 9B:
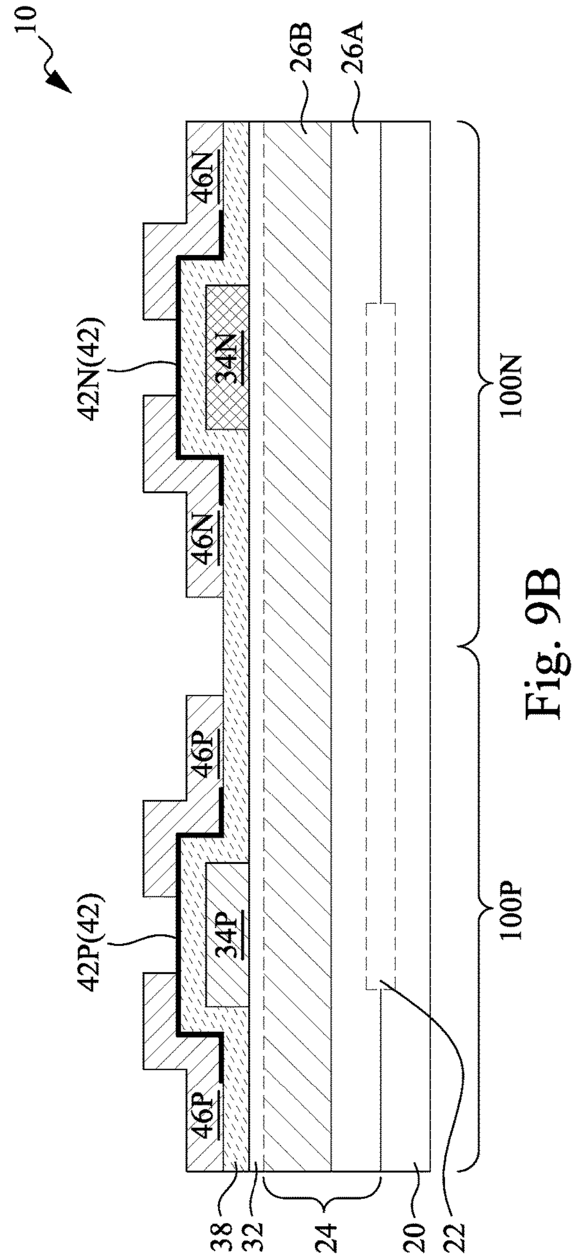

FIGS. 9A and 9B illustrate a top view and a cross-sectional view, respectively, in the formation of the source/drain contacts 46N. The respective process is illustrated as process 216 in the process flow 200 as shown in FIG. 29. In accordance with some embodiments, the formation process includes depositing a conductive material, which may include a metal such as Ti, Al, or the like, or alloys thereof, and then performing an etching process to pattern the conductive material. Source/drain contacts 46N may also include a gold (Au) layer over the Ti or Al layer to improve the contact. The deposition method may include PVD, CVD, or the like. The thickness of the lower conductive material such as the Ti layer or the Al layer may be in the range between about 10 nm and about 50 nm, and the thickness of the upper conductive material such as the Au layer may be in the range between about 10 nm and about 30 nm. The patterned conductive layers form source/drain contacts 46N, which are in physical contact with some portions of semiconductor layer 42N. FIGS. 9A and 9B illustrate that each of the source/drain contacts 46N includes a portion overlapping an end portion of gate electrode 34N, with a portion of the semiconductor layer 42N being exposed through the source/drain contacts 46N to act as the channel of the NMOS device.

In accordance with some embodiments of the present disclosure, the source/drain contacts 46P of the PMOS device and the source/drain contacts 46N of the NMOS device use different metals, for example, with source/drain contacts 46P using Pt and/or Pd, and source/drain contacts 46N using Ti and/or Al. This may reduce the contact tunneling barriers for both of the PMOS and NMOS devices, wherein the contact tunneling barriers include the barrier between semiconductor layer 42P and source/drain contacts 46P, and the barrier between semiconductor layer 42N and source/drain contacts 46N.

In subsequent processes shown in FIGS. 10A, 10B, 11A, 11B, 12A, 12B, 13A, and 13B, a channel-doping capping layer for the NMOS device and a passivation capping layer for the PMOS device are formed. The illustrated example is an NFET-first and PFET-last process, in which the formation of the channel-doping capping layer for the NMOS device is performed before the formation of the passivation capping layer for the PMOS device.

Figure 10A:
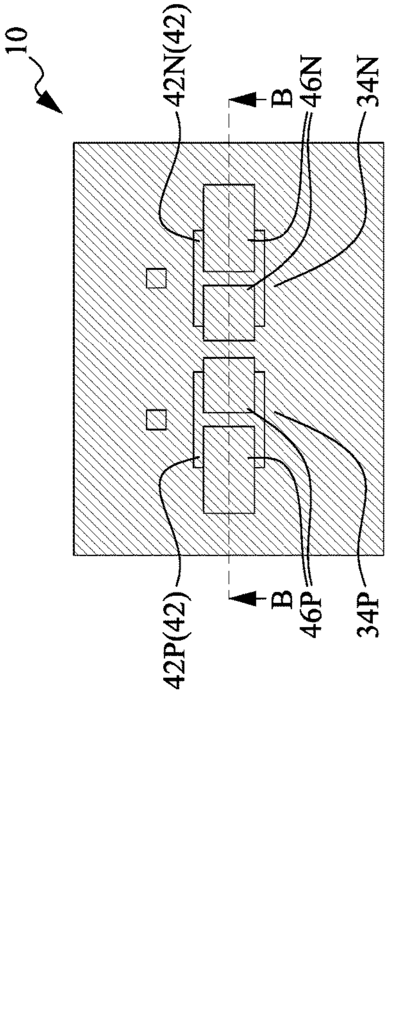
Figure 10B:
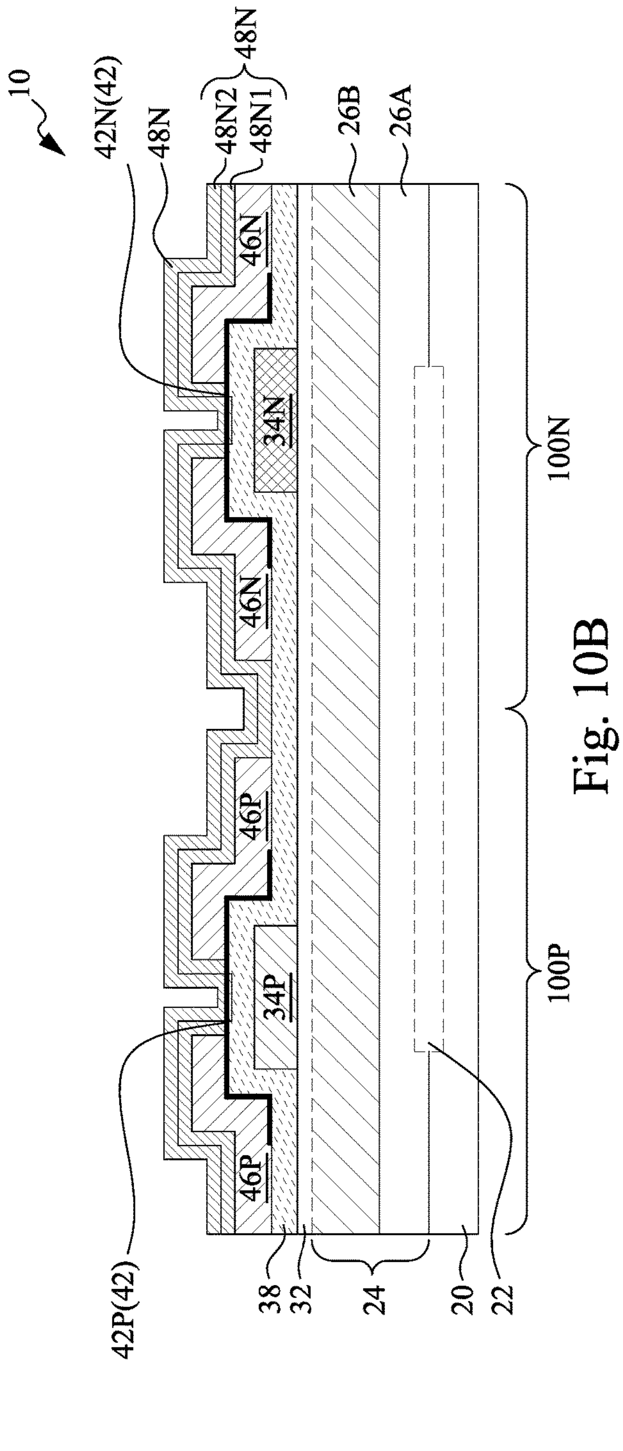

Referring to FIGS. 10A and 10B, dielectric doping layer 48N is formed. The respective process is illustrated as process 218 in the process flow 200 as shown in FIG. 29. In accordance with some embodiments, dielectric doping layer 48N is or comprises aluminum oxide ($Al_2O_3$). In accordance with some embodiments, aluminum oxide layer 48N includes lower layer 48N1, and upper layer 48N2 over lower layer 48N1. The formation of the lower layer 48N1 may include depositing an aluminum layer, for example, using PVD, and then oxidizing the aluminum layer to form an aluminum oxide layer. The deposited aluminum layer may have a very small thickness, for example, in the range between about 1 nm and about 2 nm. In the oxidation process, the deposited aluminum layer may be oxidized in open air (hence through nature oxidation), or in an oxygen ($O_2$) containing environment with a low oxygen partial pressure, for example, with the oxygen partial pressure being in the range between about 10 torr and about 500 torr. The oxidation may be performed at room temperature (for example, between about 20° C. and about 25° C.), or at a moderately elevated temperature, for example, in a temperature range between about 20° C. and about 150° C., or in a temperature range between about 100° C. and about 120° C. With the nature oxidation or the low partial pressure or the low temperature oxidation, the oxidation rate is reduced, resulting in a higher-quality aluminum oxide layer 48N1.

Figure 27:
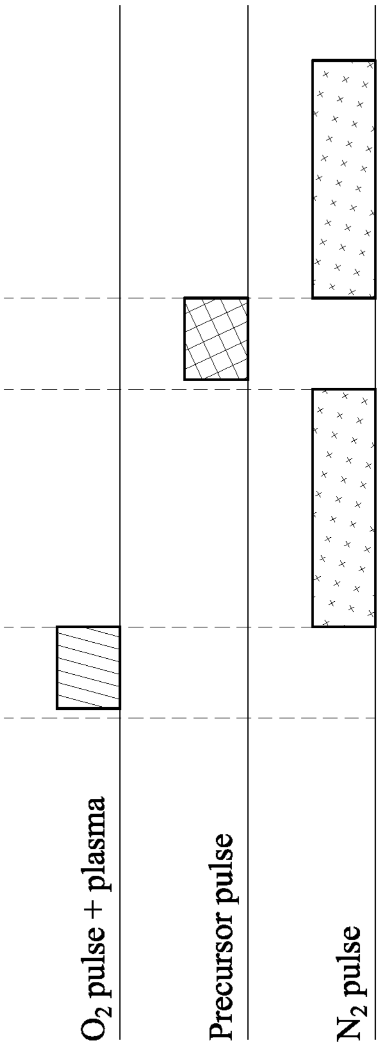
Figure 28:
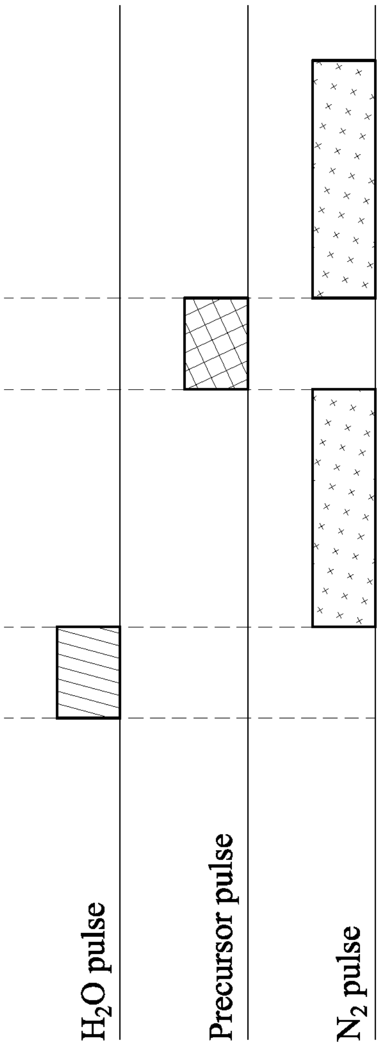

By forming an aluminum layer and then oxidizing the aluminum layer to form aluminum oxide layer 48N1, aluminum oxide layer 48N2 may be deposited on aluminum oxide layer 48N1 through ALD (such as Plasma-Enhanced ALD (PEALD) or thermal ALD as shown in FIGS. 27 and 28, respectively). The thickness of aluminum oxide layer 48N2 may be in the range between about 10 nm and about 50 nm. By forming aluminum oxide layer 48N1 as being the base on which aluminum oxide layer 48N2 is deposited, the uniformity of aluminum oxide layer 48N is improved than depositing aluminum oxide layer 48N2 directly on semiconductor layer 42. Furthermore, with the aluminum oxide layer 48N1 formed through deposition and oxidation, the water steam that may be used in the ALD process for forming aluminum oxide layer 48N2 is separated from the channel material of the NMOS device, and the sensitivity of the threshold voltage of the resulting NMOS to the doping of aluminum into semiconductor layer 42N is improved. In addition, aluminum oxide layer 48N2 is less porous.

FIG. 27 illustrates an example of a PEALD cycle for depositing aluminum oxide ($Al_2O_3$) in accordance with some embodiments. The PEALD process includes pulsing (conducting) oxygen into the respective chamber, with plasma being turned on when the oxygen is pulsed. The power of the plasma may be in the range between about 20 watts and about 60 watts, for example, with a RF power source operating at a frequency of 13.56 MHz. The oxygen is then purged through a nitrogen pulse. Next, a precursor such as trimethylaluminum (TMA, $(CH_3)_3Al)$) is pulsed, followed by the purging of the precursor through a nitrogen pulse. The PEALD cycle may cause an atomic aluminum oxide layer of about 1.2 Å to be deposited, and a plurality of PEALD cycles may increase the thickness of the aluminum oxide to the desirable thickness.

FIG. 28 illustrates an example of a thermal ALD cycle for forming aluminum oxide ($Al_2O_3$) in accordance with some embodiments. The thermal ALD process includes pulsing water steam ($H_2O$) into the respective chamber. The water steam is then purged through a nitrogen pulse. Next, a precursor such as TMA is pulsed, followed by the purging of the precursor through a nitrogen pulse. During the thermal ALD, the temperature of wafer 10 may be in the range between about 150° C. and about 300° C. The thermal ALD cycle may cause an atomic aluminum oxide layer of about 1.0 Å to be deposited, and a plurality of thermal ALD cycles may increase the thickness of the aluminum oxide to the desirable thickness. It is appreciated that since water steam may be used, aluminum oxide layer 48N1 prevents the water steam from reaching and degrading semiconductor layer 42.

In accordance with alternative embodiments, instead of forming an aluminum oxide layer as the dielectric doping layer, a hafnium oxide layer (which may be hafnium-rich) is formed as dielectric doping layer 48N. The thickness of the hafnium oxide layer or the hafnium-rich hafnium oxide layer 48N may be in the range between about 10 nm and about 50 nm. The hafnium oxide layer 48N may be formed in a PEALD process as shown in FIG. 25, which PEALD process may also be used for forming gate dielectric layer 38. As shown in FIG. 25, the PEALD process includes pulsing a precursor such as tetrakis(ethylmethylamido)hafnium (also referred to as $Hf(NMeEt)_4$) into the reaction chamber, followed by the purging of the precursor through a nitrogen pulse. Next, the oxygen is pulsed into the respective chamber, with plasma turned on when the oxygen is pulsed. The power of the plasma may be in the range between about 20 watts and about 60 watts, for example, with a RF power source operating at the frequency of 13.56 MHz. Next, the oxygen is purged through a nitrogen pulse. PEALD cycle may cause an atomic hafnium oxide layer of about 1.2 Å to be deposited, and a plurality of PEALD cycles are performed.

Figure 26:
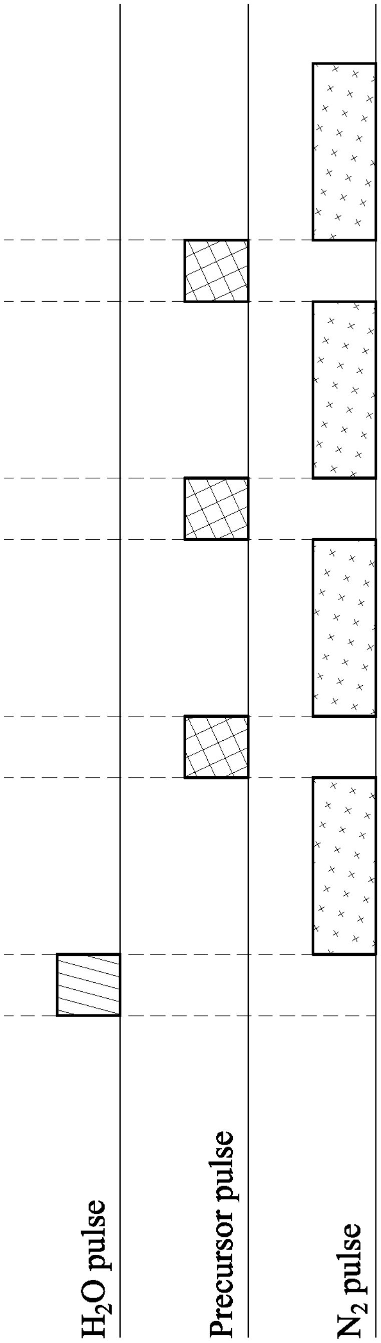

FIG. 26 illustrates an example of a thermal ALD cycle for forming hafnium-rich hafnium oxide ($HfO_2$) in accordance with some embodiments. The thermal ALD process includes pulsing water steam ($H_2O$) into the respective chamber. The water steam is then purged through a nitrogen pulse. Next, a precursor such as $Hf(NMeEt)_4$ is pulsed, followed by the purging of $Hf(NMeEt)_4$ through a nitrogen pulse. Next, one or more additional $Hf(NMeEt)_4$ pulsing and purging process is performed to increase the atomic percentage of hafnium. For example, in the hafnium-rich hafnium oxide, the hafnium atomic percentage may be greater than about 30 percent, and may be in the range between about 32 percent and about 35 percent. During the thermal ALD process, the temperature of the wafer 10 may be in the range between about 150° C. and about 300° C. The thermal ALD cycle may cause an atomic hafnium-rich hafnium oxide layer of about 1.0 Å to be deposited, and a plurality of thermal ALD cycles are performed.

Figure 11A:
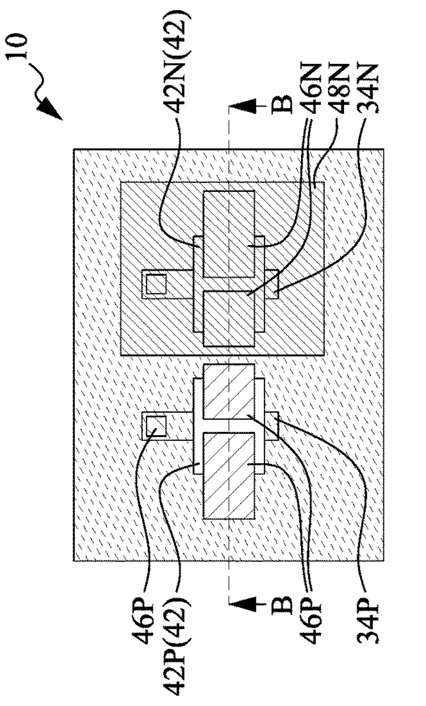
Figure 11B:
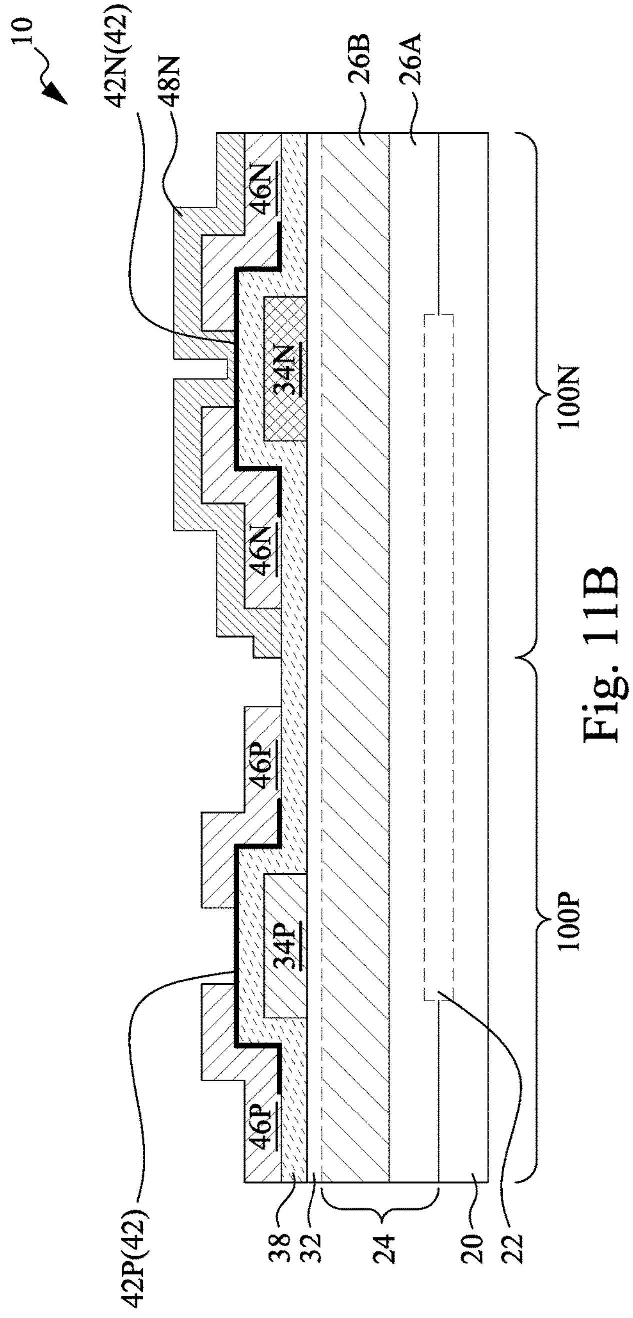

FIGS. 11A and 11B illustrate a top view and a cross-sectional view, respectively, in the patterning of dielectric doping layer 48N. The process includes the removal of dielectric doping layer 48N from device region 100P, which is performed in a lithography process. The respective process is illustrated as process 220 in the process flow 200 as shown in FIG. 29.

Figure 12A:
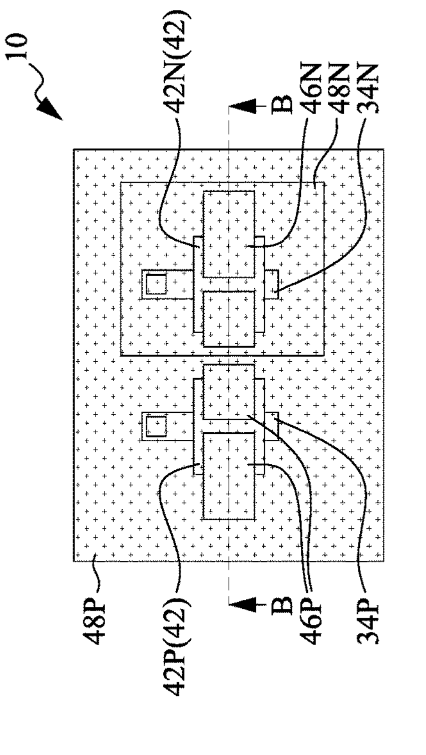
Figure 12B:
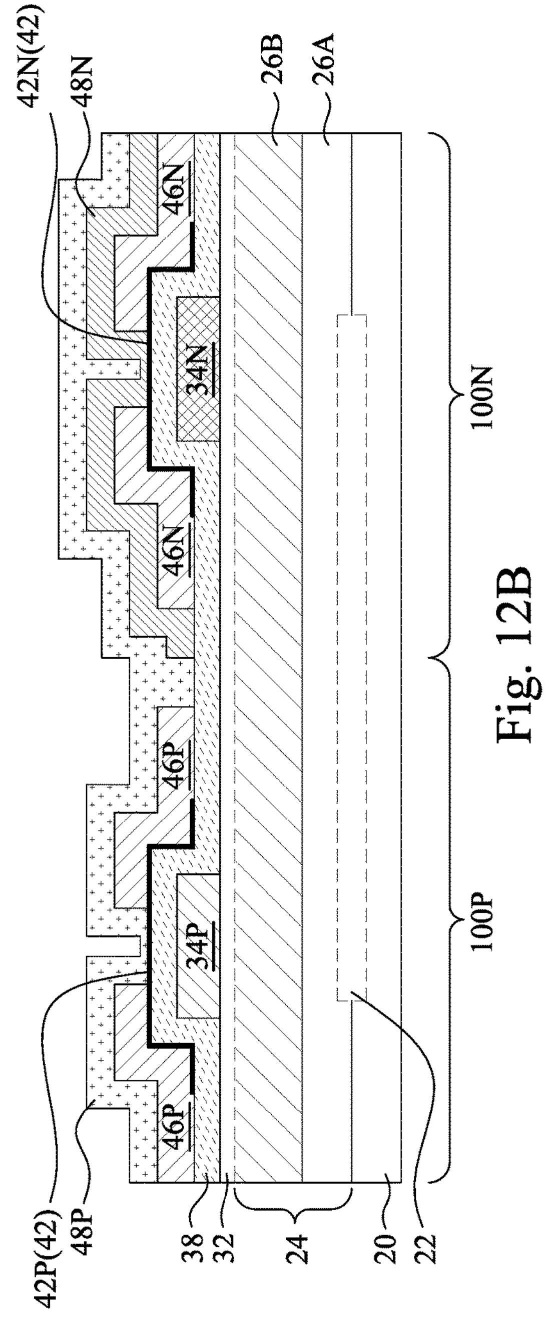

FIGS. 12A and 12B illustrate a top view and a cross-sectional view, respectively, in the deposition of dielectric passivation layer 48P. The respective process is illustrated as process 222 in the process flow 200 as shown in FIG. 29. In accordance with some embodiments, passivation layer 48P is formed of or comprises silicon oxide. The deposition method may include PVD, which may include a thermal evaporate process. The resulting passivation layer 48P may have a thickness in the range between about 10 nm and about 50 nm.

Figure 13A:
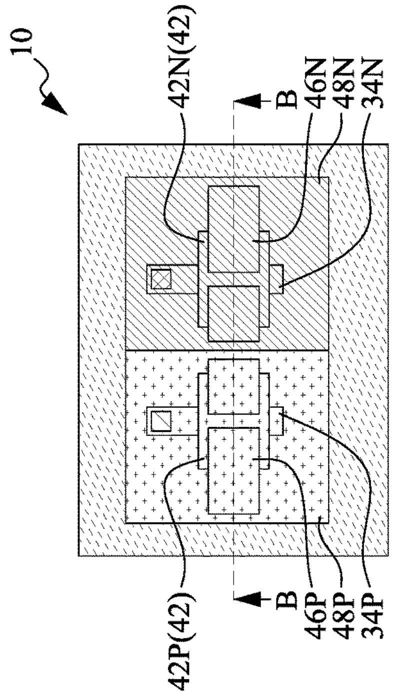
Figure 13B:
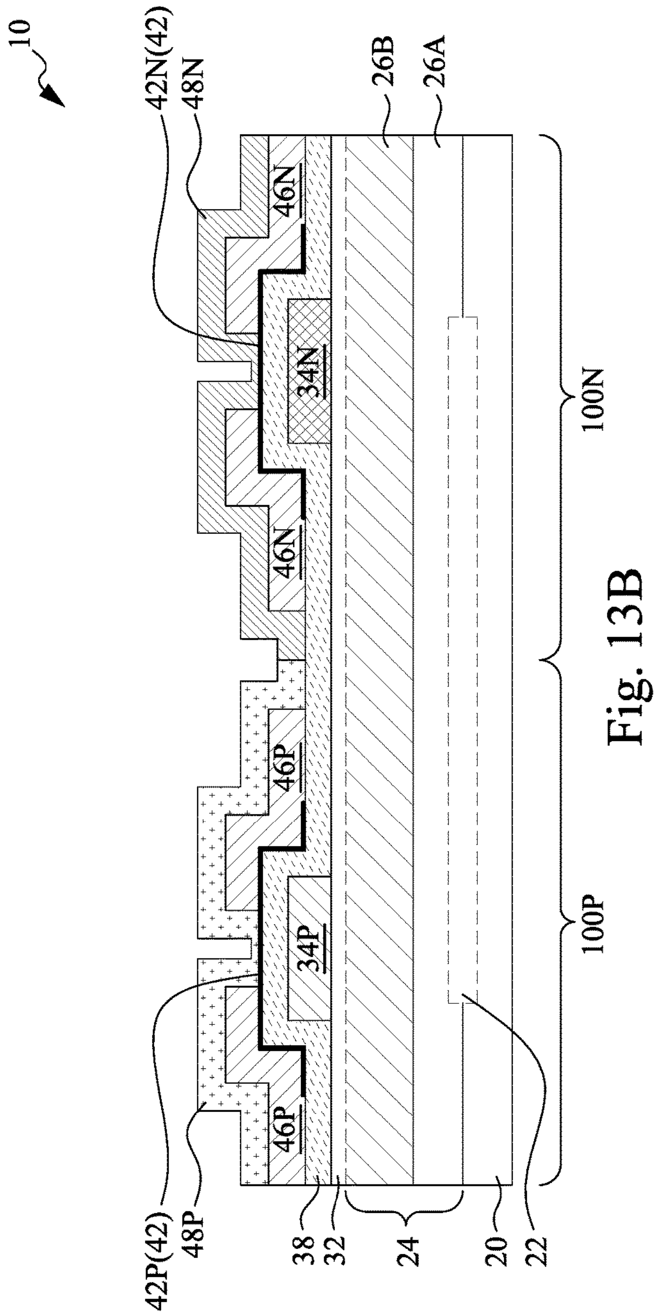

FIGS. 13A and 13B illustrate a top view and a cross-sectional view, respectively, in the patterning of passivation layer 48P. The process includes the removal of passivation layer 48P from device region 100N, which is performed in a lithography process. The respective process is illustrated as process 224 in the process flow 200 as shown in FIG. 29.

Figure 14A:
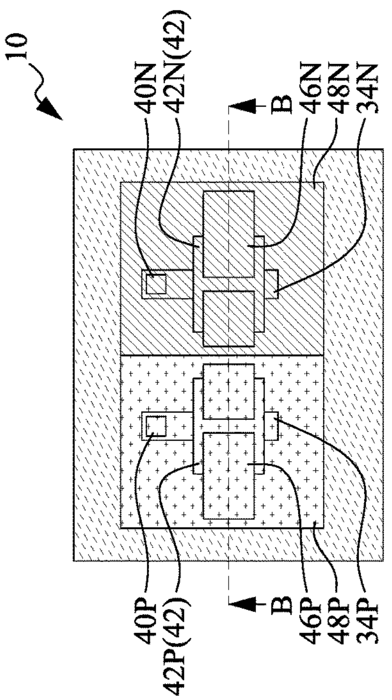
Figure 14B:
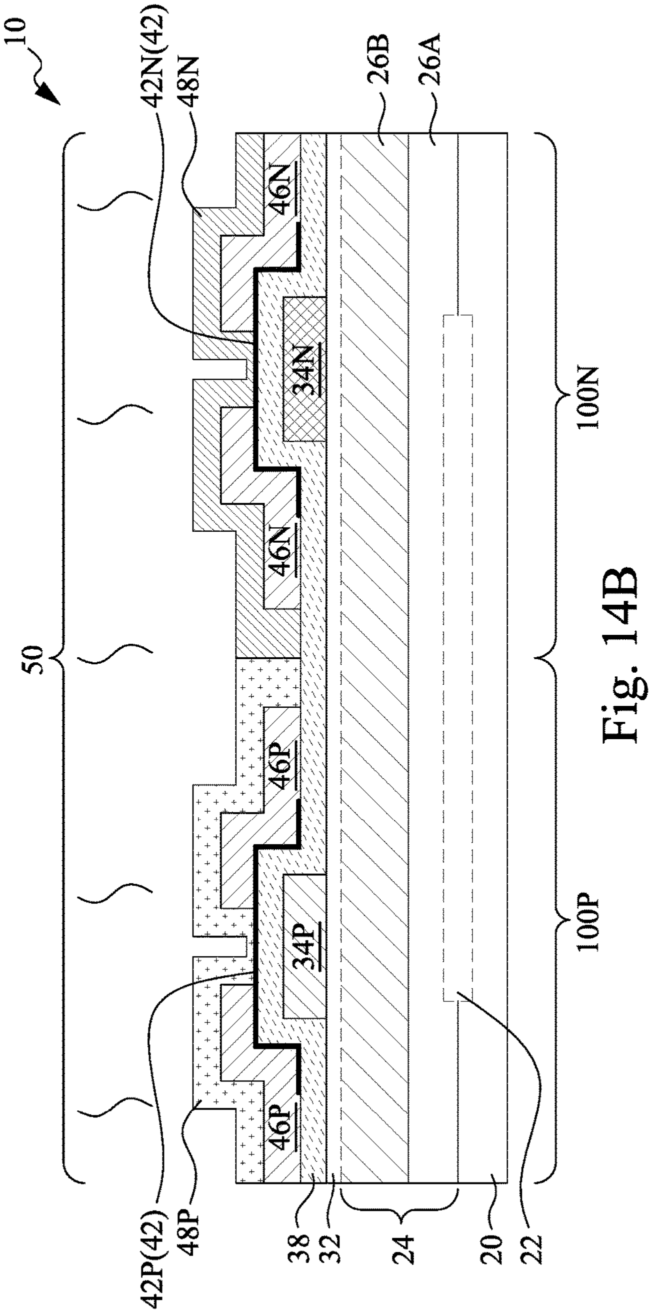

Referring to FIGS. 14A and 14B, an annealing process 50 (FIG. 14B) is performed. The respective process is illustrated as process 226 in the process flow 200 as shown in FIG. 29. The process gas may include forming gas, which includes hydrogen ($H_2$) and nitrogen ($N_2$). Carrier gas such as Ar, He, and/or the like may be added. In accordance with some embodiments, the annealing process is performed at a temperature in the range between about 250° C. and about 400° C. The annealing duration may be in the range between about 30 minutes and about 60 minutes. The gas flow rate of hydrogen in the forming gas may be in the range between about 13 percent and about 15 percent of the flow rate of the carrier gas. The ambient pressure during the annealing process may be in the range between about 100 torr and one atmosphere. The annealing process may cure passivation layer 48P and dielectric doping layer 48N. Furthermore, the aluminum or hafnium in dielectric doping layer 48N may diffuse into semiconductor layer 42N, causing the shifting of the resulting MOS device from P-side to N-side. For example, if aluminum or hafnium is not doped into semiconductor layer 42N, the resulting NMOS device in device region moN may demonstrate a negative threshold voltage (meaning the device is turned on when a negative Vgs voltage is applied). With the doping of aluminum or hafnium, the threshold voltage is increased as being a positive threshold voltage. The magnitude of threshold-voltage-tuning may be tuned through adjusting the thickness of dielectric doping layer 48N, and/or the atomic percentage of hafnium when the hafnium-rich hafnium oxide is used. In accordance with some embodiments, in the annealing process, the threshold voltage of the NMOS device is increased, for example, by an amount in a range between about 0.5 volts and about 1.0 volts. On the other hand, due to the selection of the material of the passivation layer 48P, in the anneal process, the threshold voltage of the PMOS device is unchanged.

FIGS. 15A and 15B illustrate a top view and a cross-sectional view, respectively, in the re-opening of gate contact opening 40P (FIG. 15A) and the formation of source/drain contact openings 51P (FIG. 15B). The respective process is illustrated as process 228 in the process flow 200 as shown in FIG. 29. The gate contact opening 40P as shown in FIG. 4A may have been filled with dielectric passivation layer 48P, which may be formed of or comprise silicon oxide. Hence, an etching process is performed to remove dielectric passivation layer 48P from gate contact opening 40P, and gate contact opening 40P is revealed again.

Figure 16A:
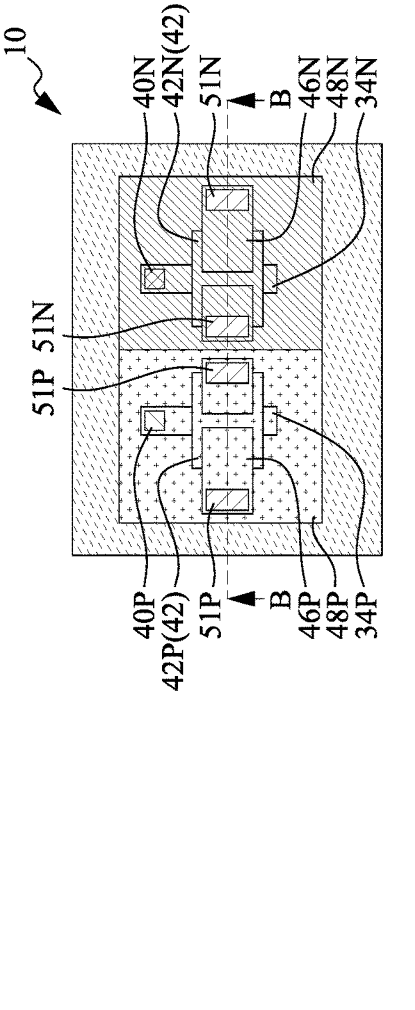
Figure 16B:
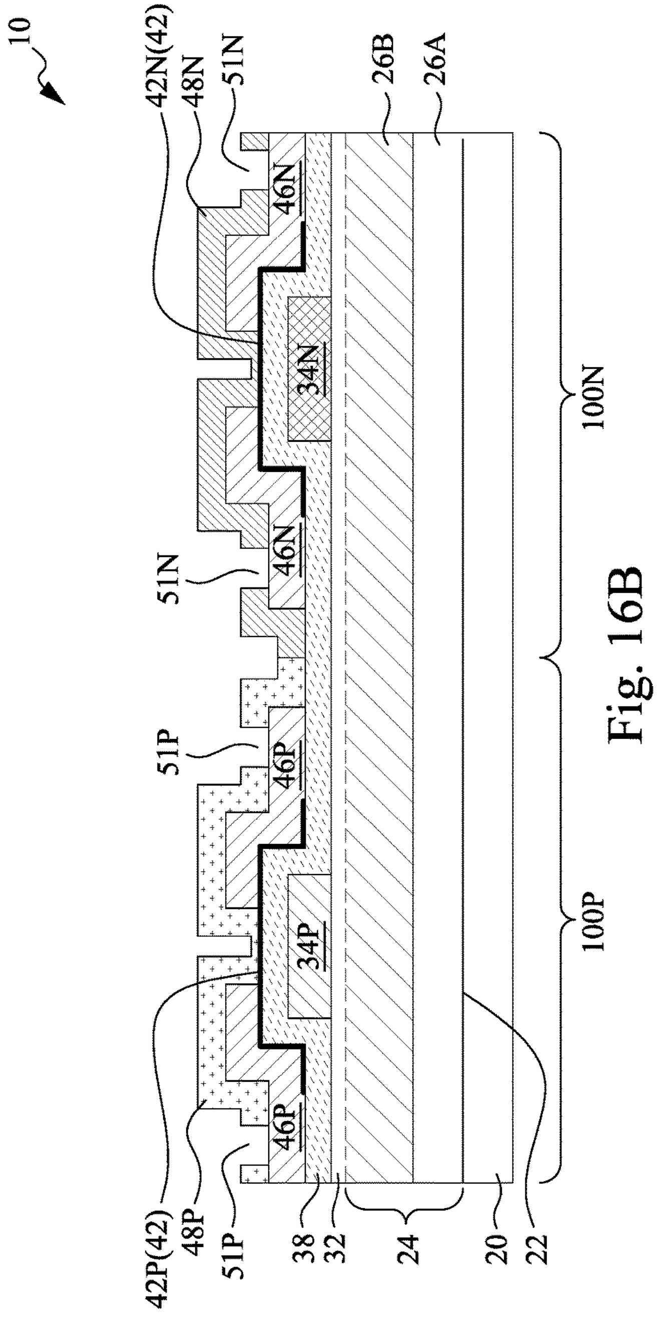

FIGS. 16A and 16B illustrate a top view and a cross-sectional view, respectively, in the re-opening of gate contact opening 40N and the formation of source/drain contact openings 51N. The respective process is illustrated as process 230 in the process flow 200 as shown in FIG. 29. The gate contact opening 40N as shown in FIG. 4A may have been filled with dielectric doping layer 48N, which may be formed of $HfO_2$, Hf-rich $HfO_2$, $Al_2O_3$, or the like. Hence, an etching process is performed to remove dielectric doping layer 48N from gate contact opening 40N, and contact opening 40N is revealed again.

Figure 17A:
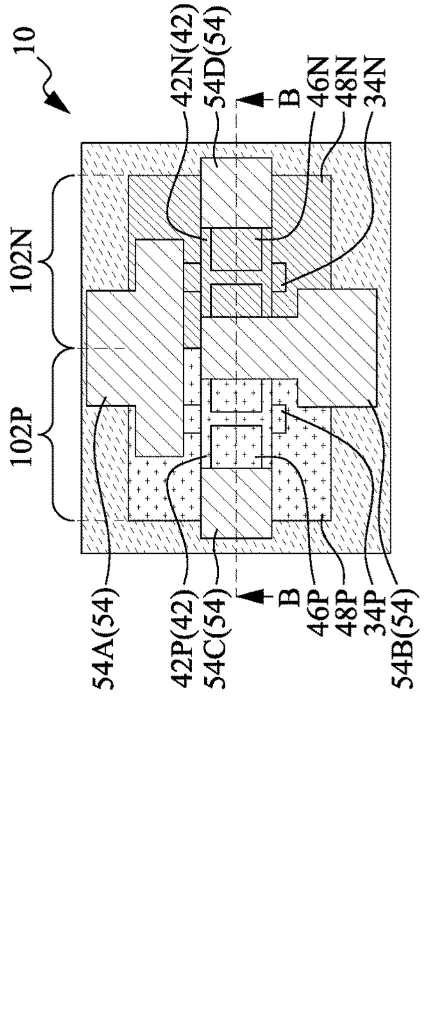
Figure 17B:
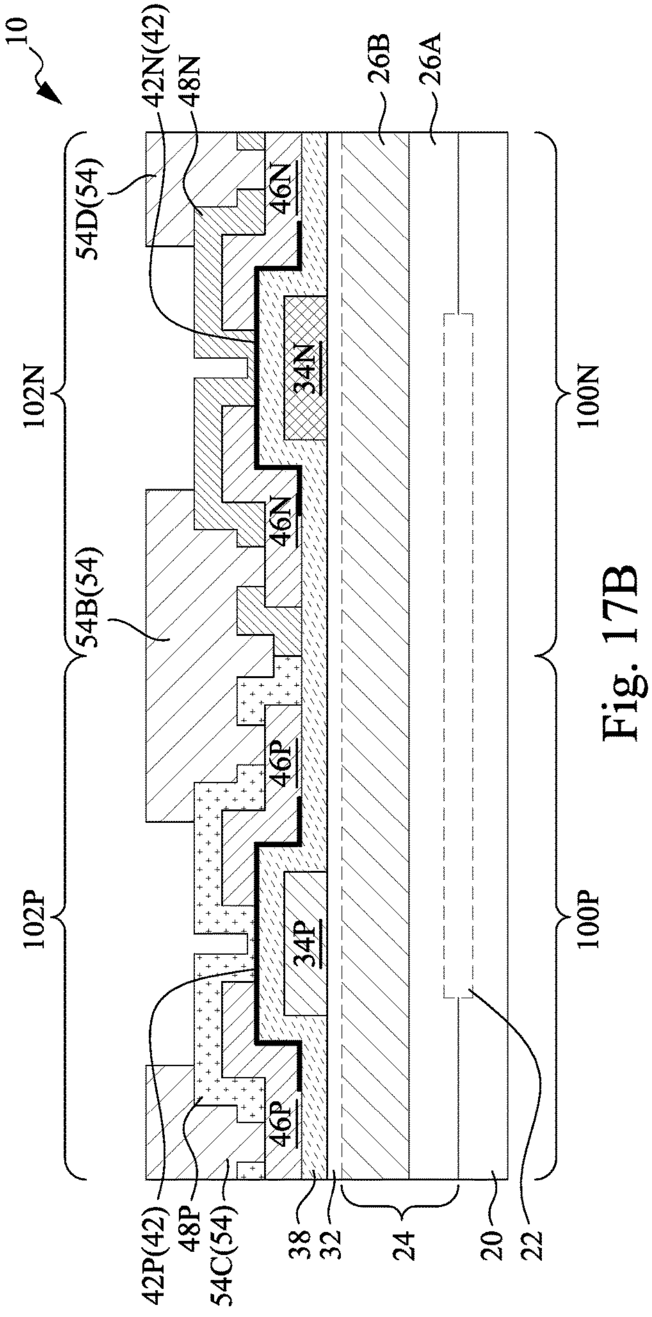

FIGS. 17A and 17B illustrate a top view and a cross-sectional view, respectively, in the formation of metal interconnections 54, which include 54A, 54B, 54C, and 54D in accordance with some embodiments. The respective process is illustrated as process 232 in the process flow 200 as shown in FIG. 29. PMOS device 102P and NMOS device 102N are thus formed, which collectively form a CMOS device. In accordance with some embodiments, metal interconnections 54 are formed of or comprise copper, aluminum, tungsten, or the like. The formation process may include PVD, CVD, or the like. In accordance with some embodiments, metal interconnection 54A interconnects gate electrodes 34P and 34N. Metal interconnection 54B interconnects the drain of NMOS device 102N and the drain of PMOS device 102P. Metal interconnections 54C and 54D are connected to the source regions of PMOS device 102P and NMOS device 102N. It is appreciated that the illustrated example connection scheme is for an inverter. If other circuits are to be formed using PMOS device 102P and NMOS device 102N, different connections are adopted.

Figure 18A:
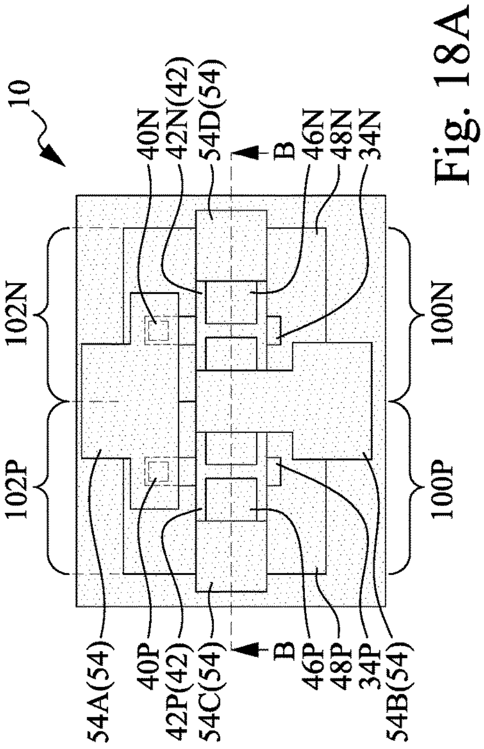
Figure 18B:
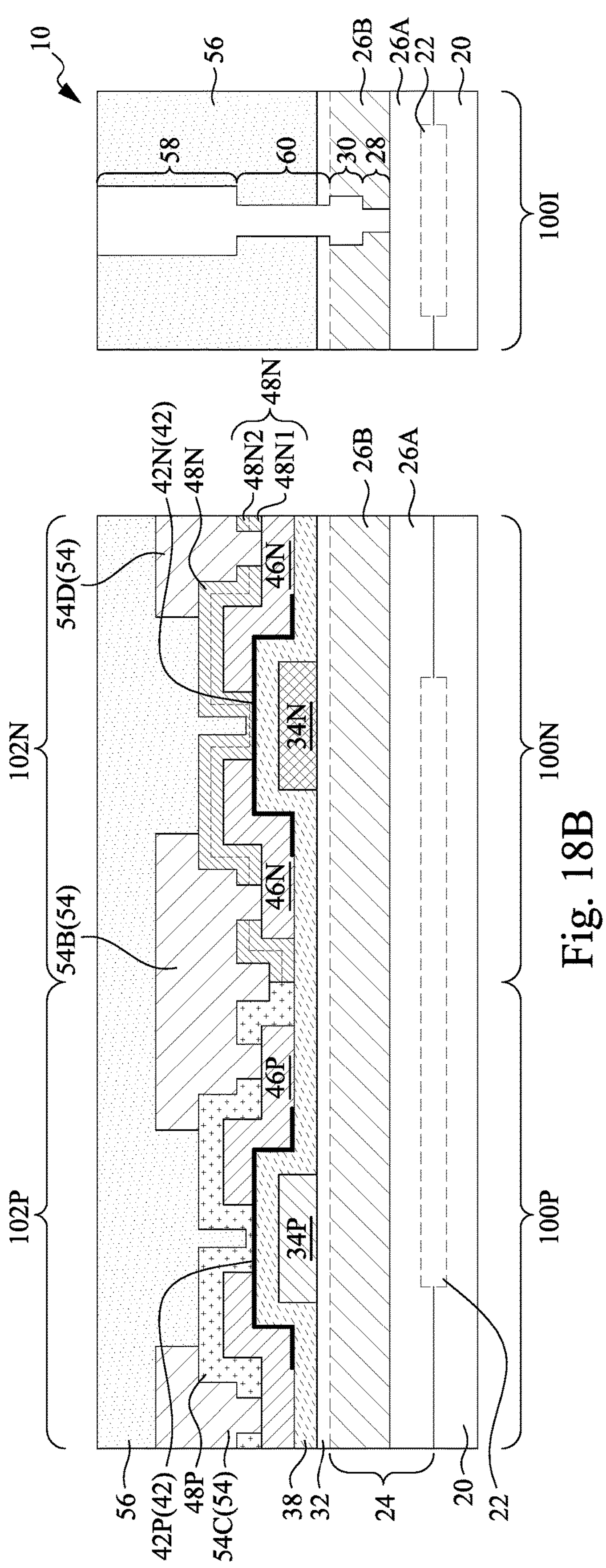

FIGS. 18A and 18B illustrate a top view and a cross-sectional view, respectively, in the formation of dielectric layer 56. The respective process is illustrated as process 234 in the process flow 200 as shown in FIG. 29. In accordance with some embodiments, dielectric layer 56 is formed of a dielectric material such as silicon oxide, silicon nitride, or the like, which may be formed using PECVD or the like method. In accordance with alternative embodiments, dielectric layer 56 is formed of a low-k dielectric material, which may be selected from the same group of candidate materials form forming dielectric layer 26B.

FIG. 18B further illustrates the formation of metal line 58 and via 60, which may be formed using a damascene process. It is appreciated that metal lines and vias may also be formed to connect to metal interconnections 54, which metal lines and vias are not shown.

Figure 19:
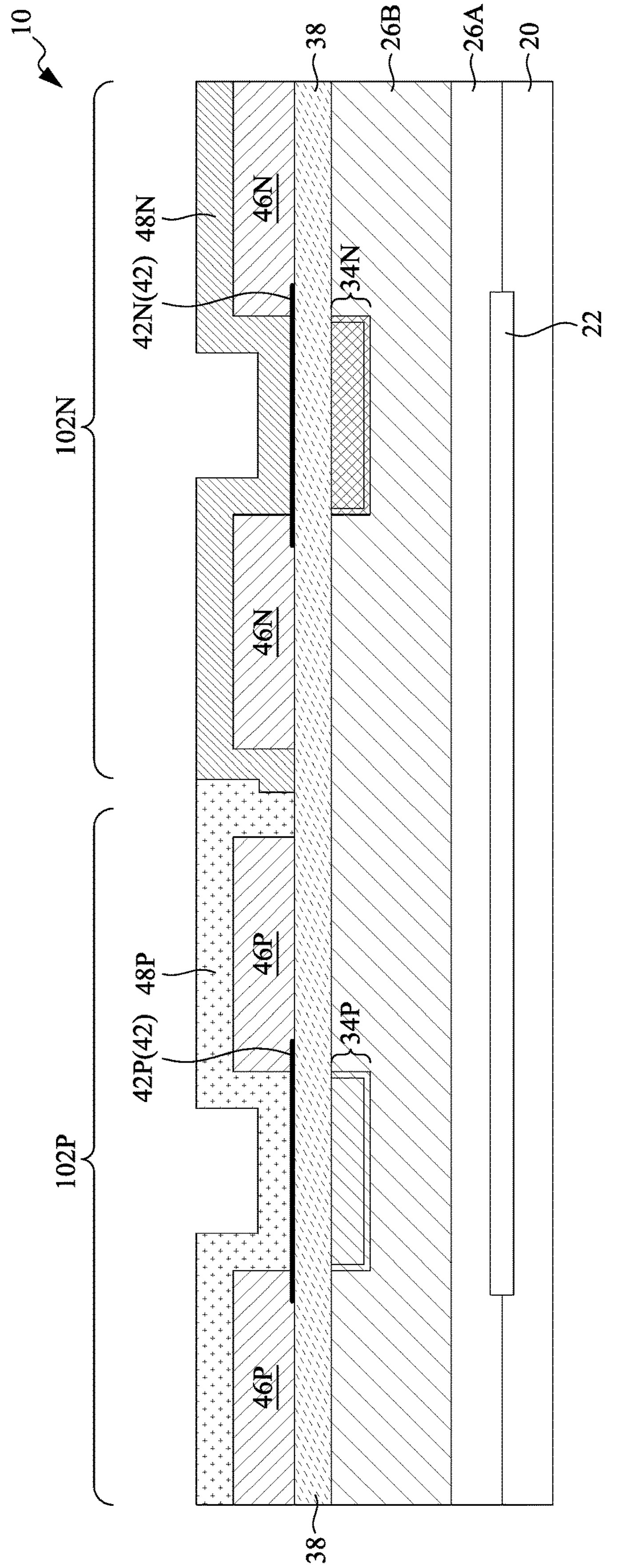
FIG. 19 illustrates a cross-sectional view of a CMOS device in accordance with some embodiments.

FIG. 19 illustrates a CMOS device including a PMOS device 102P and an NMOS device 102N in accordance with some embodiments. Unless specified otherwise, the materials and the formation processes of the components in these embodiments (and the embodiments shown in FIGS. 20 through 23) are essentially the same as the like components, which are denoted by like reference numerals in the embodiments shown in the preceding figures. The details regarding the formation process and the materials of the components shown in the preceding figures may thus be found in the discussion of the preceding embodiments.

The CMOS device shown in FIG. 19 is similar to the embodiments shown in FIGS. 18A and 18B, except that gate electrodes 34P and 34N, instead of protruding over an underlying planar dielectric layer, are formed in dielectric layer 26B, and may have top surfaces coplanar with the top surface of dielectric layer 26B. The formation of gate electrodes 34P and 34N may be performed through damascene processes, which include forming trenches in dielectric layer 26B, filling metallic layers into the trenches, and then performing a planarization process to level the top surfaces of gate electrodes 34P and 34N with the top surface of dielectric layer 26B. Gate electrodes 34P and 34N may be formed of the material as discussed referring to FIGS. 2A and 2B, and may be formed in separate processes, or may be formed of a same material (and in a same process) such as copper or a copper alloy. Gate dielectric layer 38 in accordance with these embodiments is thus a planar layer.

In the process shown in preceding FIGS. 10A and 10B through 13A and 13B, an NFET-first process is performed, in which the dielectric doping layer 48N is formed before dielectric passivation layer 48P. In accordance with alternative embodiments, as shown in FIGS. 20 through 24, a PFET-first process is performed, in which the dielectric passivation layer 48P is formed before the formation of dielectric doping layer 48N. It is appreciated that FIGS. 20 through 24 merely illustrate the formation of passivation layer 48P and dielectric doping layer 48N. Other details are not shown, and may be found referring to previous figures including FIGS. 18A and 18B and FIG. 19, and their correspond formation processes. For example, the formation of gate electrodes 34P and 34N and their shapes may be found referring to FIG. 18B or FIG. 19.

Figure 20:
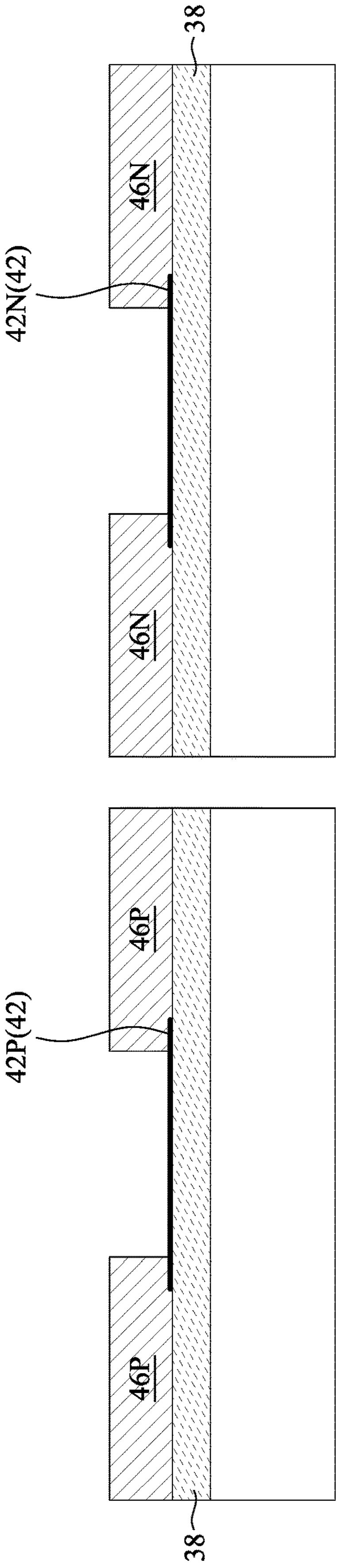
FIGS. 20 through 24 illustrate a PFET-first process in the formation of a dielectric doping layer and a passivation layer in accordance with some embodiments.
Figure 21:
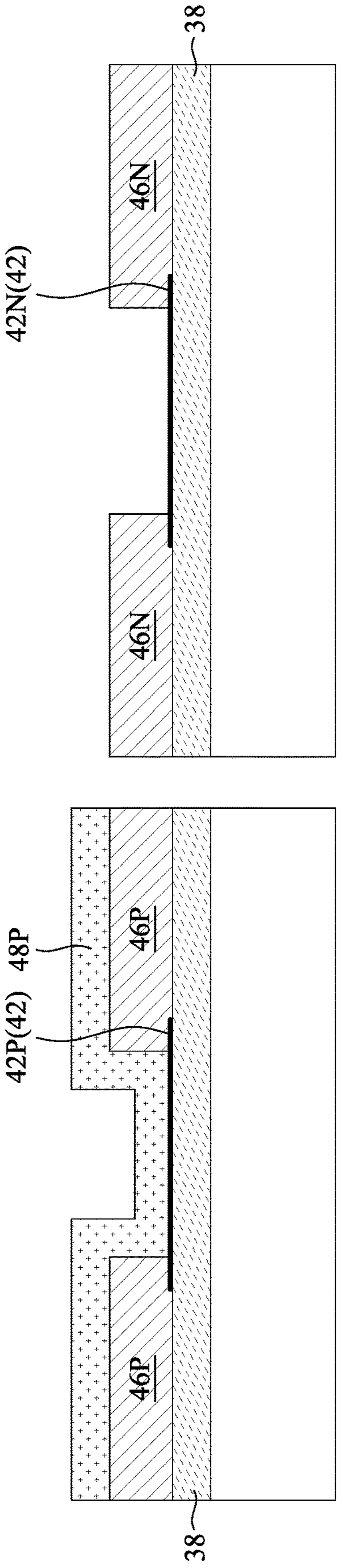
Figure 22:
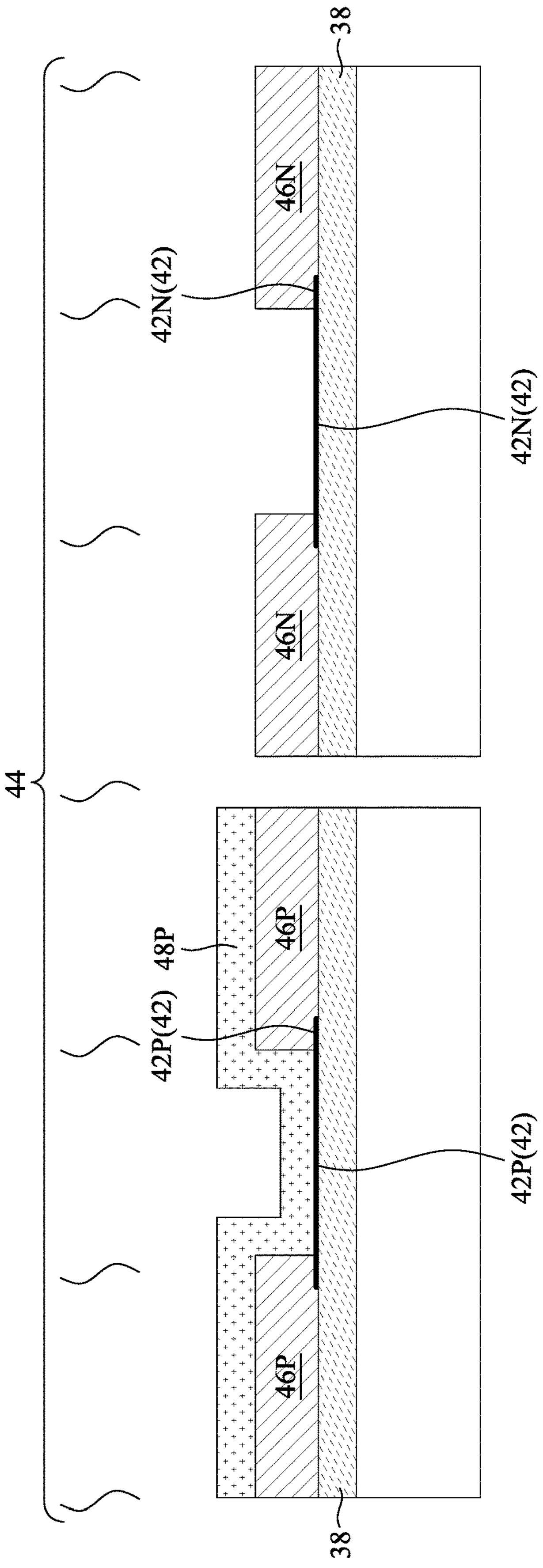
Figure 23:
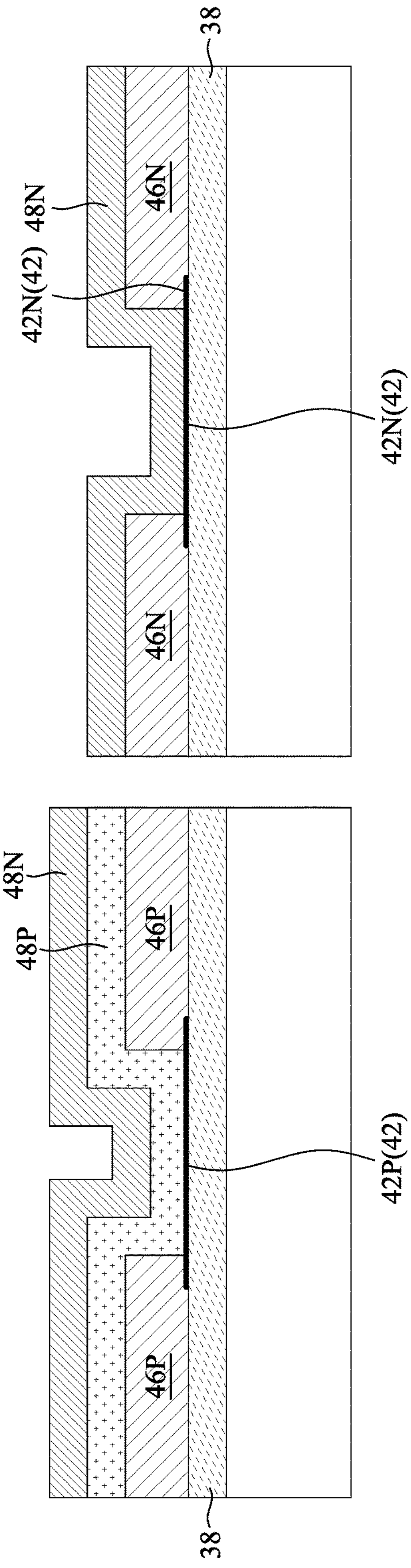
Figure 24:
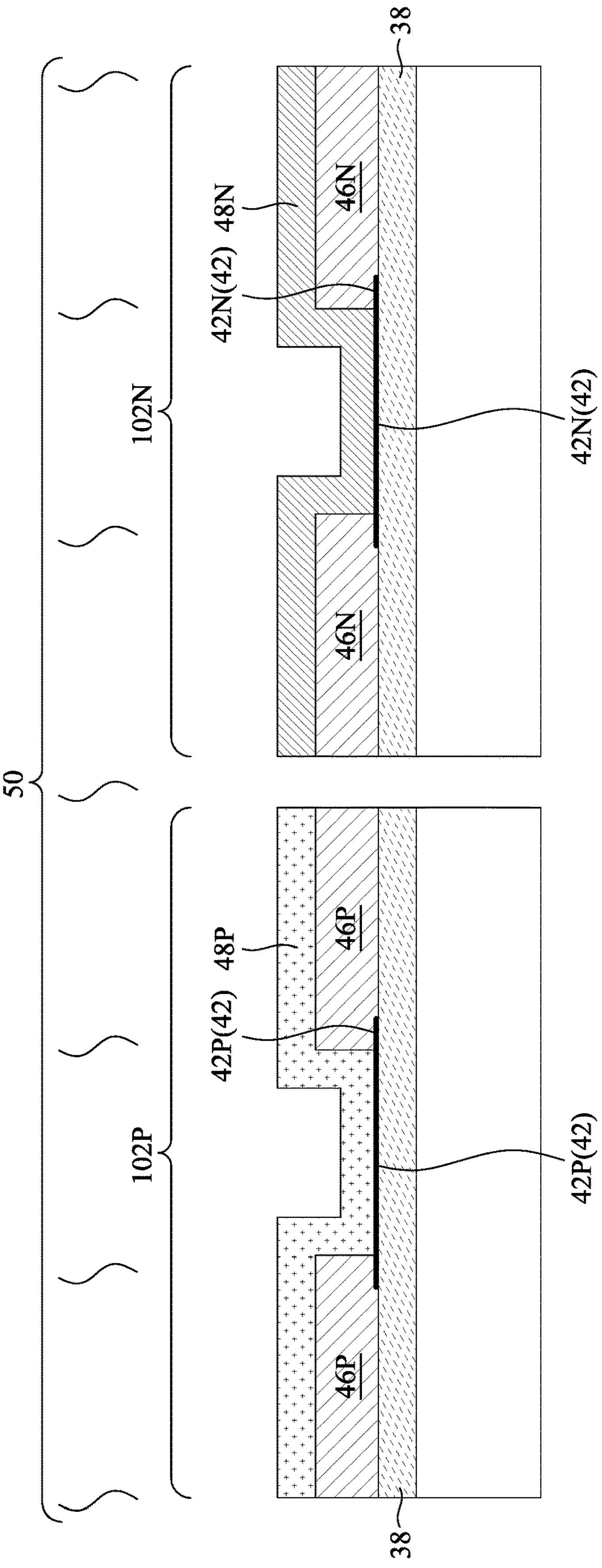

FIG. 20 illustrates the formation of gate dielectric 38, semiconductor layers 42P and 42N, and source/drain contacts 46P and 46N. Next, referring to FIG. 21, dielectric passivation layer 48P is formed. Referring to FIG. 22, annealing process 44 is performed. Next, as shown in FIG. 23, dielectric doping layer 48N is formed, which extends into both of PMOS device region 100P and NMOS device region 100N. Next, as shown in FIG. 24, the portion of dielectric doping layer 48N in device region 100P is removed, leaving dielectric doping layer 48N in device region 100N. Since dielectric passivation layer 48P is formed before the formation of dielectric doping layer 48N, the respective process is referred to as a PFET-first process. In accordance with some embodiments, annealing process 50 is performed. The subsequent process may be realized through the teaching referring to FIGS. 14A/14B-18A/18B.

The embodiments of the present disclosure have some advantageous features. By forming a dielectric doping layer over the channel of the NMOS device and doping the channel of the NMOS device with an appropriate metal such as Al or Hf, the threshold voltage of the resulting device is increased, and the resulting NMOS device, rather than having the PMOS device behavior, demonstrates proper NMOS behavior, that is, when a positive Vgs is applied, starts conducting current. By adopting different metals for source/drain contacts of the PMOS and NMOS devices, the tunneling barriers of the source/drain contacts of both of the PMOS device and NMOS device are reduced. Also, by depositing and oxidizing aluminum before depositing aluminum oxide, or adjusting the hafnium atomic percentage in the hafnium oxide, the dielectric doping layer may be used to tune the threshold voltage of the NMOS device to desirable values.

In accordance with some embodiments of the present disclosure, a method includes forming a first gate electrode and a second gate electrode; forming a gate dielectric layer extending over the first gate electrode and the second gate electrode; and forming an n-type transistor and a p-type transistor. The forming the n-type transistor comprising forming a first low-dimensional semiconductor layer over the gate dielectric layer, wherein a first portion of the first low-dimensional semiconductor layer is directly over the first gate electrode; forming first source/drain contacts on opposing sides of the first gate electrode, wherein the first source/drain contacts are in contact with first opposing portions of the first low-dimensional semiconductor layer; depositing a dielectric doping layer comprising aluminum oxide or hafnium oxide over and contacting the first low-dimensional semiconductor layer. The forming the p-type transistor comprises forming a second low-dimensional semiconductor layer over the gate dielectric layer, wherein a second portion of the second low-dimensional semiconductor layer is directly over the second gate electrode; forming second source/drain contacts on opposing sides of the second gate electrode, wherein the second source/drain contacts are in contact with second opposing portions of the second low-dimensional semiconductor layer; and depositing a dielectric passivation layer over and contacting the second low-dimensional semiconductor layer, wherein the dielectric passivation layer and the dielectric doping layer are formed of different materials. In an embodiment, the method further comprises, after the dielectric doping layer and the dielectric passivation layer are deposited, performing an annealing process to drive a metal in the dielectric doping layer into the first low-dimensional semiconductor layer. In an embodiment, the dielectric doping layer comprises aluminum oxide, and the depositing the dielectric doping layer comprises depositing an aluminum layer; oxidizing the aluminum layer to form a first aluminum oxide layer; and depositing a second aluminum oxide layer on the first aluminum oxide layer. In an embodiment, the depositing the dielectric doping layer comprises a plurality of atomic layer deposition cycles to form a hafnium-rich oxide, and wherein each of the plurality of atomic layer deposition cycles comprises a water steam pulse process and a plurality of hafnium-comprising precursor pulse processes. In an embodiment, the annealing process results in a first threshold voltage of the n-type transistor to be increased, and a second threshold voltage of the p-type transistor is unchanged by the annealing process. In an embodiment, the first source/drain contacts comprise aluminum or titanium, and the second source/drain contacts comprise palladium. In an embodiment, the first low-dimensional semiconductor layer and the second low-dimensional semiconductor layer are formed simultaneously, and comprise a material selected from the group consisting of carbon nanotube networks and aligned carbon nanotubes. In an embodiment, the method further comprises forming a low-k dielectric layer, wherein the first gate electrode and the second gate electrode are over at least a portion of the low-k dielectric layer.

In accordance with some embodiments of the present disclosure, a device comprises an n-type transistor and a p-type transistor. The n-type transistor comprises a first gate electrode; a first gate dielectric layer over the first gate electrode; a first low-dimensional semiconductor layer comprising a first portion over the first gate dielectric layer; a dielectric doping layer comprising aluminum oxide or hafnium oxide over and contacting the first low-dimensional semiconductor layer. The p-type transistor comprises a second gate electrode; a second gate dielectric layer over the second gate electrode; a second low-dimensional semiconductor layer comprising a second portion over the second gate dielectric layer; and a dielectric passivation layer over and contacting the second low-dimensional semiconductor layer, wherein the dielectric passivation layer and the dielectric doping layer are formed of different materials. In an embodiment, the dielectric passivation layer comprises silicon oxide, and the dielectric doping layer comprises aluminum oxide. In an embodiment, the dielectric passivation layer comprises silicon oxide, and the dielectric doping layer comprises hafnium oxide. In an embodiment, the hafnium oxide is hafnium-rich. In an embodiment, the n-type transistor comprises first source/drain contacts on opposing sides of the first gate electrode, wherein the first source/drain contacts are in contact with first opposing portions of the first low-dimensional semiconductor layer; and the p-type transistor comprises second source/drain contacts on opposing sides of the second gate electrode, wherein the second source/drain contacts are in contact with second opposing portions of the second low-dimensional semiconductor layer, and the first source/drain contacts and the second source/drain contacts comprise different metals. In an embodiment, the first source/drain contacts comprise aluminum or titanium, and the second source/drain contacts comprise palladium. In an embodiment, the first low-dimensional semiconductor layer comprises a top portion directly over the first gate electrode; and a sidewall portion on a sidewall of the first gate electrode.

In accordance with some embodiments of the present disclosure, a device comprises a semiconductor substrate; a low-k dielectric layer over the semiconductor substrate; an isolation layer over the low-k dielectric layer; a first work function layer over the isolation layer, wherein the first work function layer is an n-type work function layer; a first low-dimensional semiconductor layer on a first top surface and a first sidewall of the first work function layer; first source/drain contacts contacting opposing end portions of the first low-dimensional semiconductor layer; and a dielectric doping layer over and contacting a channel portion of the first low-dimensional semiconductor layer, wherein the dielectric doping layer comprises a metal selected from aluminum and hafnium, and wherein the channel portion of the first low-dimensional semiconductor layer further comprises the metal. In an embodiment, the device further comprises an additional transistor formed at a surface of the semiconductor substrate, wherein the additional transistor comprises silicon or silicon germanium as a channel material. In an embodiment, the device further comprises a second work function layer over the isolation layer, wherein the second work function layer is a p-type work function layer; a second low-dimensional semiconductor layer on a second top surface and a second sidewall of the second work function layer; second source/drain contacts contacting opposing end portions of the second low-dimensional semiconductor layer; and a dielectric passivation layer, wherein the dielectric passivation layer and the second low-dimensional semiconductor layer are free from the metal. In an embodiment, the first source/drain contacts and the second source/drain contacts comprise different metals. In an embodiment, the metal comprises hafnium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a dielectric isolation layer;

an n-type transistor comprising:

a first gate electrode on the dielectric isolation layer;

a first portion of a gate dielectric layer over the first gate electrode;

a first low-dimensional semiconductor layer over the first portion of the gate dielectric layer, wherein the first low-dimensional semiconductor layer comprises a metal;

first source/drain contacts on opposing sides of the first gate electrode, wherein the first source/drain contacts are in contact with first opposing portions of the first low-dimensional semiconductor layer; and a dielectric doping layer comprising a metal oxide of a metal, wherein the metal oxide comprises aluminum oxide or hafnium oxide, and is over and contacting the first low-dimensional semiconductor layer, wherein the dielectric doping layer is in contact with the first low-dimensional semiconductor layer, and wherein the metal in the dielectric doping layer is a same metal as in the first low-dimensional semiconductor layer; and a p-type transistor comprising:

a second gate electrode on the dielectric isolation layer;

a second portion of the gate dielectric layer over the second gate electrode;

a second low-dimensional semiconductor layer over the second portion of the gate dielectric layer;

second source/drain contacts on opposing sides of the second gate electrode, wherein the second source/drain contacts are in contact with second opposing portions of the second low-dimensional semiconductor layer; and a dielectric passivation layer over and contacting the second low-dimensional semiconductor layer, wherein the dielectric passivation layer and the dielectric doping layer are formed of different materials.

2. The device of claim 1, wherein the first portion and the second portion of the gate dielectric layer are portions of a continuous dielectric layer.

3. The device of claim 1, wherein the dielectric doping layer comprises aluminum oxide, and the dielectric passivation layer comprises silicon oxide.

4. The device of claim 1, wherein bottoms of both of the first gate electrode and the second gate electrode are in contact with a planar top surface of the dielectric isolation layer.

5. The device of claim 1 further comprising:

a semiconductor substrate underlying the dielectric isolation layer; and active devices comprising transistors at a top surface of the semiconductor substrate.

6. The device of claim 1, wherein the first source/drain contacts comprise aluminum or titanium, and the second source/drain contacts comprise palladium.

7. The device of claim 1, wherein the first low-dimensional semiconductor layer comprises:

a higher horizontal portion overlapping the first gate electrode;

a lower horizontal portion laterally offset from the first gate electrode; and a vertical portion connecting the higher horizontal portion to the lower horizontal portion.

8. The device of claim 1 further comprising an interconnect structure underlying the dielectric isolation layer, wherein the interconnect structure comprises a low-k dielectric material.

9. A device comprising:

an n-type transistor comprising:

a first gate electrode;

a first gate dielectric layer over the first gate electrode;

a first low-dimensional semiconductor layer comprising a first portion over the first gate dielectric layer, wherein the first low-dimensional semiconductor layer comprises a metal; and a dielectric doping layer comprising a metal oxide of a metal, wherein the metal oxide comprises aluminum oxide or hafnium oxide, and is over and contacting the first low-dimensional semiconductor layer, wherein the dielectric doping layer is in contact with the first low-dimensional semiconductor layer, and wherein the metal in the dielectric doping layer is a same metal as in the first low-dimensional semiconductor layer; and a p-type transistor comprising:

a second gate electrode;

a second gate dielectric layer over the second gate electrode;

a second low-dimensional semiconductor layer comprising a second portion over the second gate dielectric layer; and a dielectric passivation layer over and contacting the second low-dimensional semiconductor layer, wherein the dielectric passivation layer and the dielectric doping layer are formed of different materials.

10. The device of claim 9, wherein the dielectric passivation layer comprises silicon oxide, and the dielectric doping layer comprises aluminum oxide.

11. The device of claim 9, wherein the dielectric passivation layer comprises silicon oxide, and the dielectric doping layer comprises hafnium oxide.

12. The device of claim 11, the hafnium oxide is hafnium-rich.

13. The device of claim 9, wherein:

the n-type transistor comprises first source/drain contacts on opposing sides of the first gate electrode, wherein the first source/drain contacts are in contact with first opposing portions of the first low-dimensional semiconductor layer; and the p-type transistor comprises second source/drain contacts on opposing sides of the second gate electrode, wherein the second source/drain contacts are in contact with second opposing portions of the second low-dimensional semiconductor layer, and the first source/drain contacts and the second source/drain contacts comprise different metals.

14. The device of claim 13, wherein the first source/drain contacts comprise aluminum or titanium, and the second source/drain contacts comprise palladium.

15. The device of claim 9, wherein the first low-dimensional semiconductor layer comprises:

a top portion directly over the first gate electrode; and a sidewall portion on a sidewall of the first gate electrode.

16. A device comprising:

a semiconductor substrate;

a dielectric layer over the semiconductor substrate;

an isolation layer over the dielectric layer;

a first work function layer over the isolation layer, wherein the first work function layer is an n-type work function layer;

a first low-dimensional semiconductor layer on a first top surface and a first sidewall of the first work function layer;

first source/drain contacts contacting opposing end portions of the first low-dimensional semiconductor layer; and a dielectric doping layer over and contacting a channel portion of the first low-dimensional semiconductor layer, wherein the dielectric doping layer comprises a metal selected from aluminum and hafnium, and wherein the channel portion of the first low-dimensional semiconductor layer further comprises the metal that is comprised within the dielectric doping layer.

17. The device of claim 16 further comprising an additional transistor formed at a surface of the semiconductor substrate, wherein the additional transistor comprises silicon or silicon germanium as a channel material.

18. The device of claim 16 further comprising:

a second work function layer over the isolation layer, wherein the second work function layer is a p-type work function layer;

a second low-dimensional semiconductor layer on a second top surface and a second sidewall of the second work function layer;

second source/drain contacts contacting opposing end portions of the second low- dimensional semiconductor layer; and a dielectric passivation layer, wherein the dielectric passivation layer and the second low- dimensional semiconductor layer are free from the metal.

19. The device of claim 18, wherein the first source/drain contacts and the second source/drain contacts comprise different metals.

20. The device of claim 16, wherein the metal comprises hafnium.

* * * * *